(12) United States Patent
Hosoyachi et al.

(10) Patent No.: US 11,355,525 B2
(45) Date of Patent: Jun. 7, 2022

(54) ACTIVE MATRIX SUBSTRATE AND DISPLAY DEVICE INCLUDING THE SAME

(71) Applicant: SHARP KABUSHIKI KAISHA, Osaka (JP)

(72) Inventors: Kohei Hosoyachi, Osaka (JP); Yuhichiroh Murakami, Osaka (JP); Shige Furuta, Osaka (JP); Takahiro Yamaguchi, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 17/335,758

(22) Filed: Jun. 1, 2021

(65) Prior Publication Data

US 2022/0013543 A1    Jan. 13, 2022

(30) Foreign Application Priority Data

Jul. 10, 2020    (JP) .............................. JP2020-119380

(51) Int. Cl.
| | |
|---|---|
| *G09G 3/36* | (2006.01) |
| *H01L 27/12* | (2006.01) |
| *G02F 1/1362* | (2006.01) |
| *G09G 3/00* | (2006.01) |

(52) U.S. Cl.
CPC ...... *H01L 27/124* (2013.01); *G02F 1/136286* (2013.01); *G09G 3/006* (2013.01); *G09G 3/3648* (2013.01); *G09G 3/3688* (2013.01); *G09G 2300/0809* (2013.01);
(Continued)

(58) Field of Classification Search
CPC ......... G09G 3/3611; G09G 2320/0209; G09G 2310/027; G09G 2310/08; G09G 3/3655; G09G 2310/0278; G09G 2310/0286; G09G 2310/0289; G09G 2310/0294; G09G 3/3688; G09G 3/006; G09G 3/3648; G09G 2300/0809; G09G 2310/0297;
(Continued)

(56) References Cited

U.S. PATENT DOCUMENTS

| | | | | |
|---|---|---|---|---|
| 9,218,768 | B2 * | 12/2015 | Lee | ...................... G09G 3/3291 |
| 9,293,074 | B2 * | 3/2016 | Tajika | ..................... G01R 31/26 |
| 9,875,676 | B2 * | 1/2018 | Byun | ....................... G09G 3/20 |

(Continued)

FOREIGN PATENT DOCUMENTS

WO    2014/112459 A1    7/2014

*Primary Examiner* — Duc Q Dinh
(74) *Attorney, Agent, or Firm* — ScienBiziP, P.C.

(57) ABSTRACT

A layout pattern of a demultiplexer circuit of a display device employing the SSD method is configured as described below. Specifically, demultiplexers in the demultiplexer circuit are grouped with three demultiplexers as one set, and nine transistors as switching elements included in the three demultiplexers of each set are arranged to be aligned in the extending direction of a source line with three transistors as a unit while positions of the nine transistors are sequentially shifted in the vertical direction with respect to the source line. Furthermore, any two adjacent sets are arranged such that a direction in which nine transistors included in one set are shifted in the vertical direction with three transistors as a unit and a direction in which nine transistors in the other set are shifted in the above-described vertical direction with three transistors as a unit are opposite to each other.

11 Claims, 36 Drawing Sheets

(52) U.S. Cl.
CPC ............... *G09G 2310/0297* (2013.01); *G09G 2320/0233* (2013.01); *G09G 2330/12* (2013.01)

(58) Field of Classification Search
CPC ........ G09G 2330/12; G09G 2320/0233; H01L 27/124; G02F 1/136286
See application file for complete search history.

(56) References Cited

U.S. PATENT DOCUMENTS

| | | | |
|---|---|---|---|
| 10,490,147 B2* | 11/2019 | Shima | G09G 3/20 |
| 10,733,952 B2* | 8/2020 | Lin | G09G 3/3688 |
| 2015/0356940 A1 | 12/2015 | Yamaguchi et al. | |
| 2018/0068615 A1* | 3/2018 | Imai | G09G 3/3225 |

\* cited by examiner

ACTIVE MATRIX SUBSTRATE AND DISPLAY DEVICE INCLUDING THE SAME

CROSS-REFERENCE TO RELATED APPLICATIONS

This application claims the benefit of priority to Japanese Patent Application Number 2020-119380 filed on Jul. 10, 2020. The entire contents of the above-identified application are hereby incorporated by reference.

BACKGROUND

Technical Field

The present disclosure relates to an active matrix substrate and a display device including the same, and more particularly to an active matrix substrate including a circuit that controls supply of video signals to data signal lines such as a demultiplexer that demultiplexes time-division multiplexed video signals and supplies demultiplexed video signals to two or more data signal lines, and a display device including the same.

In display devices such as an active matrix liquid crystal display device, an active matrix substrate is used, the active matrix substrate being formed with a plurality of data signal lines (also referred to as "source lines"), a plurality of scanning signal lines (also referred to as "gate lines") intersecting the plurality of data signal lines, and a plurality of pixel circuits arranged in a matrix along the plurality of data signal lines and the plurality of scanning signal lines. In such display devices, some devices employ a method (hereinafter referred to as "Source Shared Driving (SSD) method" in which a plurality of data signal lines in an active matrix substrate is grouped into a plurality of groups of data signal lines with two or more data signal lines as one group, and data signals are supplied to the two or more data signal lines in each group in a time-multiplexed manner.

In the SSD method, a demultiplexer circuit including a plurality of demultiplexers respectively corresponding to the plurality of groups is used, and the demultiplexer circuit is typically formed on the active matrix substrate together with the plurality of pixel circuits. A data side drive circuit outputs a plurality of data signals (also referred to as "multiplexed data signals"), each of which is a time-division multiplexed video signal, to the plurality of demultiplexers. Each demultiplexer includes two or more switching elements each connected to the two or more data signal lines of a corresponding group. An analog voltage as each data signal from the data side drive circuit is supplied to either of the two or more data signal lines via a switching element in the on state among two or more switching elements in a corresponding demultiplexer, and a switching element to be in the on state in each demultiplexer is switched sequentially. When the switching element connected to the data signal line in the corresponding demultiplexer is in the on state, each data signal line is supplied with a data signal via a switching element and then, when the switching element changes to the off state, the analog voltage as the data signal is held in a wiring line capacitance of the data signal line. By activating (selecting) any of the plurality of scanning signal lines in a state in which the analog voltage as the data signal is held in each data signal line in the above-described manner, the voltage of the data signal line is written as pixel data to a pixel circuit connected to the activated scanning signal line.

In a case where the SSD method described above is employed in a display device having a narrow pixel pitch such as a head-mounted display (hereinafter abbreviated as "HDM"), transistors constituting the plurality of demultiplexers sometimes cannot be arranged in the vertical direction with respect to the data signal line on the active matrix substrate. In this case, a configuration in which each of two or more transistors constituting the plurality of demultiplexers is grouped, and the two or more transistors constituting each group are arranged to be aligned in the extending direction of the data signal line while being sequentially shifted in the vertical direction with respect to the data signal line, in other words, a configuration (hereinafter referred to as a "diagonal arrangement configuration") in which a plurality of transistors constituting one group is arranged to be aligned in a diagonal direction with respect to the data signal line is employed.

For example, in a demultiplexer circuit in the display device according to the first embodiment described in WO 2014/112459, a demultiplexer for distributing a video signal of the n-th signal input line Vn to three data signal lines SLRn, SLGn, and SLBn is constituted by transistors 13R2, 13G2, and 13B1 as illustrated in FIG. 3 of the document, and the transistors 13R2, 13G2, and 13B1 are arranged to be aligned in the extending direction of data lines SLRn, SLGn, and SLBn while positions of the transistors 13R2, 13G2, and 13B1 are shifted in the vertical direction with respect to the data lines SLRn, SLGn, and SLBn. In addition, transistors constituting a demultiplexer for distributing a video signal of the (n+1)-th signal input line Vn+1 to three data signal lines SLRn+1, SLGn+1, and SLBn+1 are arranged in the same manner. Thus, in the demultiplexer circuit in the display device according to the first embodiment described in WO 2014/112459, transistors constituting the demultiplexer are grouped into each of three transistors (for constituting one demultiplexer), and the three transistors constituting each group are arranged to be aligned in the extending direction of the data signal line while the being sequentially shifted in the vertical direction with respect to the data signal line (however, in this example, two of the three transistors are arranged in the vertical direction with respect to the data line).

SUMMARY

In a display device employing the SSD method, in a case where the above-described diagonal arrangement configuration is employed for the transistors as the switching elements constituting the demultiplexer circuit, there occurs a portion in which data signal lines having lengths largely different from each other are adjacent to each other. In a case where such adjacent data signal lines are driven, a difference occurs in the degree of charge between a pixel capacitance connected to one of the adjacent data signal lines and a pixel capacitance connected to the other according to the difference in the lengths of the adjacent data signal lines (details will be described later). As a result, for example, in a case where monochrome display is to be performed with uniform gray scale, striped unevenness may be visually recognized in a display screen in the adjacent portion of the adjacent data signal lines.

Thus, it is desirable to prevent the striped unevenness from being visually recognized, even in a case where the transistors as the switching elements for controlling the supply of the video signals (data signals) to the data signal lines such as the switching elements of the demultiplexer circuit cannot be arranged in the vertical direction with respect to the data signal line due to the narrow pixel pitch.

(1) An active matrix substrate according to some embodiments of the present disclosure is an active matrix substrate including a display portion formed with a plurality of pixel circuits, the active matrix substrate comprising:

a plurality of data signal lines configured to transmit a plurality of video signals representing an image to be displayed on the display portion to the plurality of pixel circuits; and a signal supply control circuit including a plurality of connection control switching elements respectively corresponding to the plurality of data signal lines and configured to supply each of the plurality of video signals to be applied to each of the plurality of data signal lines to each of the plurality of data signal lines via corresponding each of the plurality of connection control switching elements, wherein in the signal supply control circuit, the plurality of connection control switching elements is grouped into a plurality of sets of switching element group with two or more switching elements as one set, the switching element group of each of the plurality of sets is arranged to be aligned in an extending direction of the plurality of data signal lines with a predetermined number of the switching elements as a unit while a position of the switching element group of each of the plurality of sets is sequentially shifted in the vertical direction with respect to the plurality of data signal lines, and in any two adjacent sets, a direction in which a position of the switching element group of one set is shifted in the vertical direction with the predetermined number of switching elements as the unit and a direction in which a position of the switching element group of another set is shifted in the vertical direction with the predetermined number of switching elements as the unit is opposite to each other.

(2) The active matrix substrate according to some embodiments of the disclosure includes the above-described configuration (1), wherein the signal supply control circuit is a demultiplexer circuit including a plurality of demultiplexers respectively corresponding to a plurality of groups of data signal lines obtained by grouping the plurality of data signal lines with two or more data signal lines as one group and including a plurality of input terminals respectively corresponding to the plurality of demultiplexers, the demultiplexer circuit receives, at each of the plurality of input terminals, multiplexed data in which two or more data signals that are video signals to be supplied to the two or more data signal lines in a group corresponding to each of the plurality of demultiplexers corresponding to each of the plurality of input terminals is time-division multiplexed, each of the plurality of demultiplexers includes two or more connection control switching elements respectively corresponding to the two or more data signal lines in the group corresponding to each of the plurality of demultiplexer, and is configured to supply two or more data signals obtained by demultiplexing the multiplexed data signals to be supplied to the input terminals corresponding to the demultiplexer by the two or more connection control switching elements to the two or more data signal lines, respectively, in the demultiplexer circuit, the plurality of demultiplexers is grouped into a plurality of sets with a predetermined number of demultiplexers as one set, the connection control switching elements included in the predetermined number of demultiplexers in each of the plurality of sets are arranged to be aligned in an extending direction of the plurality of data signal lines with the predetermined number of switching elements as a unit while positions of the connection control switching elements included in the predetermined number of demultiplexers in each of the plurality of sets are sequentially shifted in the vertical direction with respect to the plurality of data signal lines, and in any two adjacent sets, a direction in which positions of the connection control switching elements included in the predetermined number of demultiplexers of one set are shifted in the vertical direction with the predetermined number of switching elements as the unit and a direction in which positions of the connection control switching elements included in the predetermined number of demultiplexers of another set are shifted in the vertical direction with the predetermined number of switching elements as the unit is opposite to each other.

(3) An active matrix substrate according to some embodiments of the disclosure includes the above-described configuration (2), wherein in the demultiplexer circuit, the connection control switching elements included in the predetermined number of the demultiplexers of each of the plurality of sets are arranged to be aligned in the extending direction of the plurality of data signal lines with the connection control switching elements included in one demultiplexer as a unit while positions of the connection control switching elements included in the predetermined number of the demultiplexers of each of the plurality of sets are sequentially shifted in the vertical direction with respect to the plurality of data signal lines.

(4) The active matrix substrate according to some embodiments of the present disclosure includes the above-described configuration (2) or (3), wherein each connection control switching element in each of the plurality of demultiplexers is constituted by either only one of an N-channel transistor or a P-channel transistor.

(5) The active matrix substrate according to some embodiments of the present disclosure includes the above-described configuration (2) or (3), wherein each connection control switching element in each of the plurality of demultiplexers is constituted by an N-channel transistor and a P-channel transistor connected in parallel with each other.

(6) An active matrix substrate according to some embodiments of the disclosure includes the above-described configuration (5), wherein the N-channel transistor and the P-channel transistor constituting each connection control switching element in each of the plurality of demultiplexers are arranged to be aligned in the extending direction of the plurality of data signal lines.

(7) An active matrix substrate according to some embodiments of the disclosure includes the above-described configuration (5), wherein the N-channel transistor and the P-channel transistor constituting each connection control switching element in each of the plurality of demultiplexers are arranged to be aligned in the vertical direction with respect to the plurality of data signal lines.

(8) An active matrix substrate according to some embodiments of the disclosure includes the above-described configuration (2), wherein in the demultiplexer circuit, two or more control signal lines are arranged as control signal lines transmitting a plurality of types of control signals required for controlling each connection control switching element included in each of the plurality of demultiplexers to each of the plurality of demultiplexers, for each of the plurality of types of control signals.

(9) An active matrix substrate according to some embodiments of the disclosure includes the above-described configuration (8), wherein in the demultiplexer circuit, a set in which the connection control switching elements are arranged such that positions of the connection control switching elements included in the predetermined number of demultiplexers of the one set are shifted in the vertical direction in the same direction as a direction in which the connection control switching elements are shifted in the vertical direction with the predetermined number of switching elements as a unit is equally connected to the two or more control signal lines arranged for each of the plurality of types of control signals, and a set in which the connection control switching elements are arranged such that positions of the connection control switching elements included in the predetermined number of demultiplexers of the other set are shifted in the vertical direction in the same direction as a direction in which the connection control switching elements are shifted in the vertical direction with the predetermined number of switching elements as a unit is equally connected to the two or more control signal lines arranged for each of the plurality of types of control signals.

(10) An active matrix substrate according to some embodiments of the disclosure includes the above-described configuration (2), wherein
the connection control switching elements included in each of the plurality of demultiplexers are thin film transistors, and in the demultiplexer circuit, for each of the connection control switching elements included in the predetermined number of demultiplexers of the one set, for a thin film transistor as each of the switching elements and for a thin film transistor as each of the switching elements to which a control signal that is the same as or the same type as a control signal supplied to each of the switching elements in the one set among the connection control switching elements included in the predetermined number of demultiplexers in another set is supplied, the drain is arranged on the same side with respect to the gate.

(11) An active matrix substrate according to some embodiments of the disclosure includes any of the above-described configurations (1) to (9), wherein
the plurality of connection control switching elements respectively corresponding to the plurality of data signal lines is a thin film transistor.

(12) An active matrix substrate according to some embodiments of the disclosure includes the above-described configuration (1), wherein
the signal supply control circuit is a video inspection circuit configured to control whether to supply any of one or more inspection video signals supplied from outside to each of the plurality of data signal lines and is configured to supply any of the inspection video signals to each of the plurality of data signal lines via a corresponding connection control switching element.

(13) A display device according to some embodiments of the present disclosure is an active matrix substrate including any of above-described configurations (2) to (11);
a data side drive circuit configured to supply, as a multiplexed data signal, a signal in which two or more data signals respectively to be supplied to the two or more data signal lines in the group corresponding to each of the plurality of input terminals is time-division multiplexed to each of the plurality of input terminals; and
a demultiplexing control circuit configured to generate demultiplexing control signals to control each connection control switching element in each of the plurality of demultiplexers so that the two or more data signals respectively to be supplied to the two or more data signal lines in the group corresponding to each of the plurality of demultiplexers are generated by demultiplexing the multiplexed data signal supplied to each of the plurality of input terminals from the data side drive circuit by each of the plurality of demultiplexers corresponding to each of the plurality of input terminal.

According to some embodiments of the disclosure, in a signal supply control circuit, which may function as for example the demultiplexer circuit in the display device employing the SSD method or as the video inspection circuit of the active matrix substrate, the plurality of connection control switching elements respectively corresponding to the plurality of data signal lines in the display portion is grouped into a plurality of sets of switching element group with two or more switching elements as one set, the switching element group of each of the plurality of sets is arranged to be aligned in an extending direction of the plurality of data signal lines in a display portion with a predetermined number of the switching elements as a unit while a position of the switching element group of each of the plurality of sets is sequentially shifted in the vertical direction with respect to the plurality of data signal lines, and in any two adjacent sets, a direction in which a position of the switching element group of one set is shifted in the vertical direction with the predetermined number of switching elements as the unit and a direction in which a position of the switching element group of another set is shifted in the above-described vertical direction with the predetermined number of switching elements as the unit is opposite to each other. In this way, the connection control switching elements in the signal supply control circuit are arranged in a diagonal direction in which the direction of shift in the vertical direction is alternately reversed for each set. Thus, when attention is paid to a layout pattern of a path in the signal supply control circuit supplying the video signal (data signal) to each data signal line, not only for adjacent data signal lines connected to connection control switching elements in the same set, but also adjacent data signal lines connected to connection control switching elements in different sets, the difference between the layout patterns of two paths respectively corresponding to each of these adjacent data signal lines is relatively small. Thus, the substantial lengths (lengths in consideration of the path layout pattern in the signal supply control circuit) of any adjacent data signal lines do not differ greatly. Thus, no significant difference in charging rate occurs for any adjacent data signal lines in a case where such adjacent data signal lines are driven. As a result, occurrence of the striped unevenness in the display screen can be suppressed while the signal supply control circuit is formed integrally with the pixel circuit by a diagonal arrangement configuration in the active matrix substrate having a narrow pixel pitch.

BRIEF DESCRIPTION OF DRAWINGS

The disclosure will be described with reference to the accompanying drawings, wherein like numbers reference like elements.

DESCRIPTION OF EMBODIMENTS

In the following, embodiments will be described with reference to the accompanying drawings. Note that in each of the transistors referred to below, the gate terminal corresponds to a control terminal, one of the drain terminal and the source terminal corresponds to a first conduction terminal, and the other corresponds to a second conduction terminal. Furthermore, "connection" in the present description means "electrical connection" unless otherwise specified, and in the scope without departing from the subject matters of the present disclosure, it includes not only a case to mean direct connection, but also a case to mean indirect connection through other elements.

1. First Embodiment 1.1 Overall Configuration and Operation Outline

Figure 1:
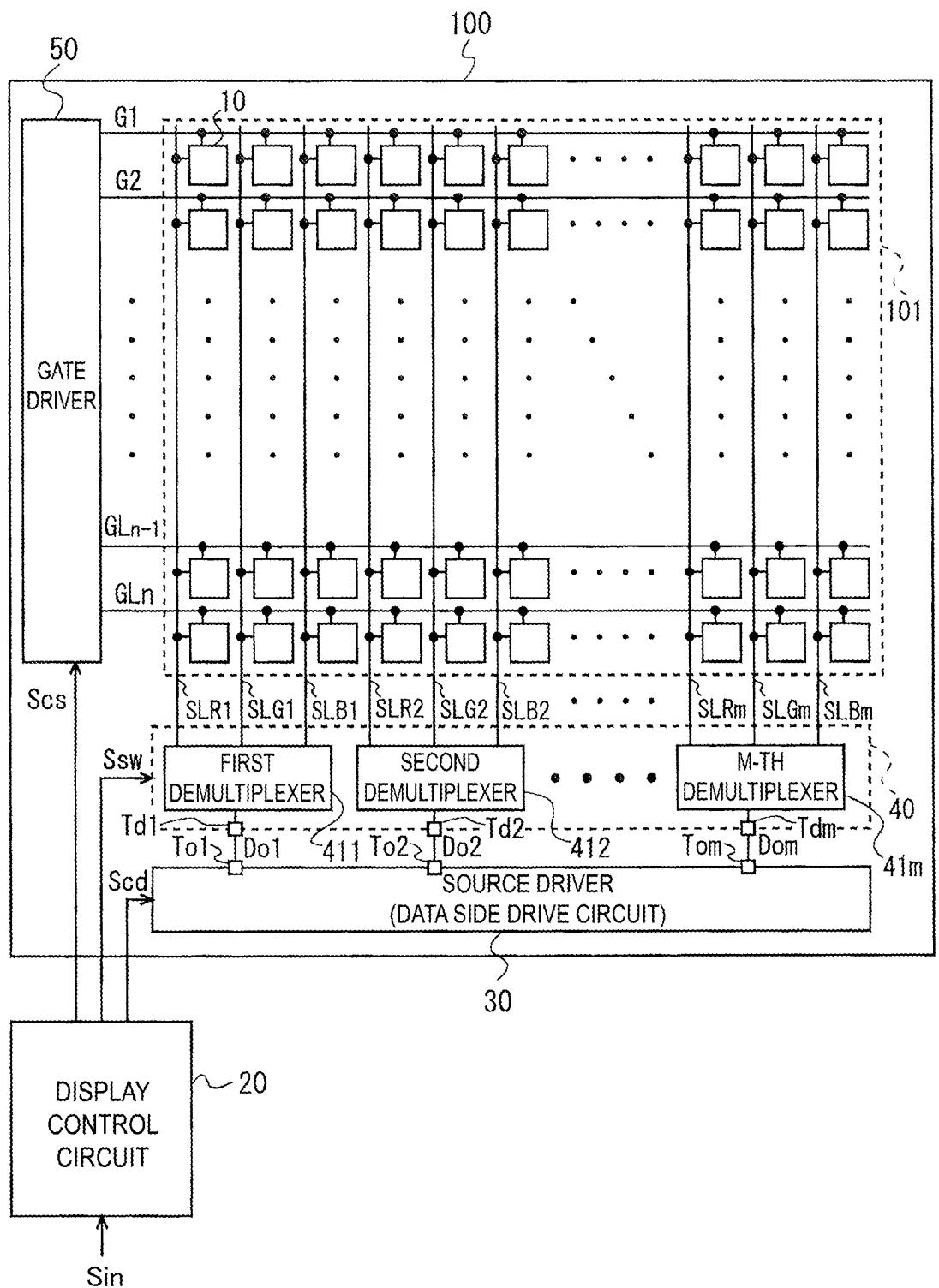
FIG. 1 is a block diagram illustrating an overall configuration of an active matrix display device according to a first embodiment.

FIG. 1 is a block diagram illustrating an overall configuration of a liquid crystal display device employing the SSD method (hereinafter referred to as "display device of the first embodiment") including an active matrix substrate 100 according to a first embodiment. On the active matrix substrate 100, a display portion 101 is formed and a gate driver 50 as a scanning signal line drive circuit and a demultiplexer circuit 40 are formed, and furthermore a source driver 30 as a data side drive circuit is mounted (for example, COG mounted). The display device according to the first embodiment includes the active matrix substrate 100, the source driver 30 mounted thereon and in addition, a display control circuit 20. An input signal Sin is supplied to the display control circuit 20 from the outside, and the input signal Sin includes an image signal representing an image to be displayed and a timing control signal for displaying the image. The display device according to the first embodiment displays a color image of three primary colors constituted by red (R), green (G), and blue (B) on the display portion 101 based on the input signal Sin.

Figure 2:
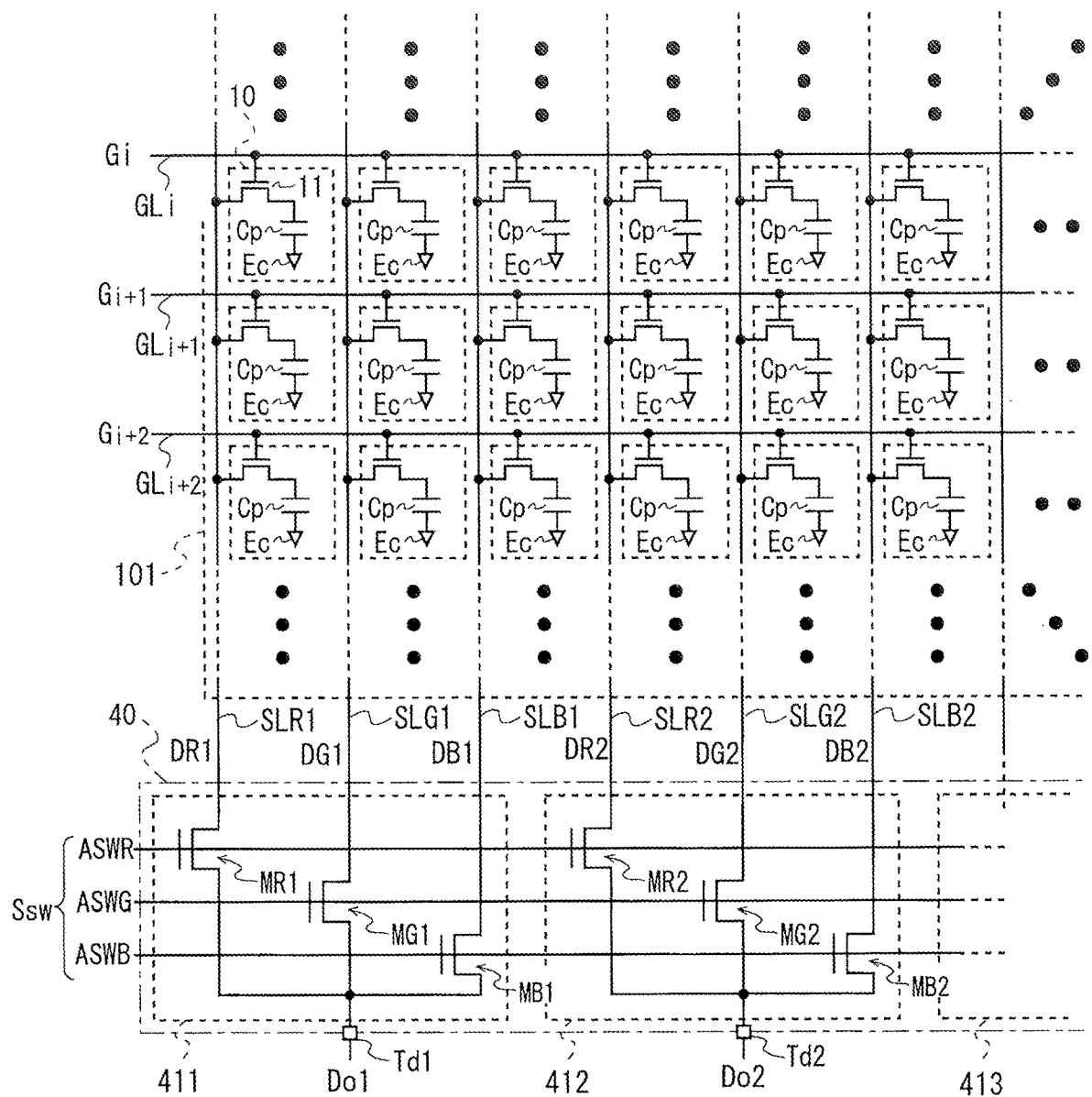
FIG. 2 is a circuit diagram illustrating a configuration of a demultiplexer circuit along with an electrical configuration of a display portion in the first embodiment.

FIG. 2 is a circuit diagram illustrating a configuration of the demultiplexer circuit 40 in the active matrix substrate 100 according to the present embodiment along with an electrical configuration of the display portion 101. As illustrated in FIG. 1 and FIG. 2, in the display portion 101 of the active matrix substrate 100, m groups of source line groups (SLR1, SLG1, and SLB1) to (SLRm, SLGm, and SLBm), in other words 3 m source lines SLR1, SLG1, and SLB1 to SLRm, SLGm, and SLBm, as data signal lines, with three source lines SLRj, SLGj, and SLBj as one group, a plurality of (n) gate lines GL1 to GLn as scanning signal lines, and a plurality of (n×3 m) pixel circuits 10 arranged in a matrix along the source lines SLR1, SLG1, and SLB1 to SLRm, SLGm, and SLBm and the gate lines GL1 to GLn are arranged.

Each pixel circuit 10 corresponds to any one of the source lines SLR1, SLG1, and SLB1 to SLRm, SLGm, and SLBm, corresponds to any one of the gate lines GL1 to GLn, and is connected to corresponding gate line GLi and source line SLXj (i=1 to n, j=1 to m, X=R, G, and B). Here, the source line SLRj is a signal line for transmitting a data signal DRj indicating a red pixel, the source line SLGj is a signal line for transmitting a data signal DGj indicating a green pixel, and the source line SLBj is a signal line for transmitting a data signal DBj indicating a blue pixel. The pixel circuit 10 connected to the source line SLRj is a pixel circuit for forming the red pixel, the pixel circuit 10 connected to the source line SLGi is a pixel circuit for forming the green pixel, and the pixel circuit 10 connected to the source line SLBj is a pixel circuit for forming the blue pixel (j=1 to m).

As illustrated in FIG. 2, each pixel circuit 10 includes a thin film transistor (hereinafter abbreviated as "TFT") 11 as a switching element in which a gate terminal is connected to a corresponding gate line GLi and a source terminal is connected to a corresponding source line SLXj (X is any one of R, B, and G), and a pixel electrode Ep connected to a drain terminal of the TFT (hereinafter, also referred to as "pixel TFT") 11. Each pixel circuit 10 constitutes a pixel forming section for forming one pixel in the image to be displayed together with a common electrode Ec commonly provided to the n×3 m pixel circuits 10, and a liquid crystal layer sandwiched between the pixel electrode Ep and the common electrode Ec and commonly provided to the n×3 m pixel circuits 10. A pixel capacitance Cp is constituted by liquid crystal capacitance formed by the pixel electrode Ep and the common electrode Ec. Although an auxiliary capacity is typically provided in parallel with the liquid crystal capacitance so that a voltage is reliably held in the pixel capacitance Cp, the auxiliary capacity is not directly related to the present disclosure, and thus the description and illustration thereof will be omitted.

As the pixel TFT 11 in the pixel circuit 10, a thin film transistor using amorphous silicon for the channel layer, a thin film transistor using low-temperature polysilicon for the channel layer (LTPS-TFT), a thin film transistor using an oxide semiconductor for the channel layer (hereinafter referred to as "oxide TFT") and the like can be employed. As the oxide TFT, for example, a thin film transistor having an oxide semiconductor layer including an In—Ga—Zn—O based semiconductor (for example, indium gallium zinc oxide) can be employed. The gate driver 50 and the demultiplexer circuit 40 are formed integrally with the pixel circuit 10 on the active matrix substrate 100. Thus, the same semiconductor material as that of the channel layer of the pixel TFT 11 in the pixel circuit 10 is used for the channel layer of the TFT in the demultiplexer circuit 40. Alternatively, in the present embodiment, it is also possible to employ a configuration in which the oxide semiconductor is used for the channel layer of the pixel TFT 11 in the pixel circuit 10, and the low-temperature polysilicon is used for the channel layer of the TFT in the gate driver 50, the demultiplexer circuit 40, and the like. The same applies to other embodiments described later.

The display control circuit 20 receives the input signal Sin from the outside, and based on the input signal Sin, generates and outputs a data side control signal Scd, a scanning side control signal Scs, a demultiplexing control signal Ssw, and a common voltage Vcom (not illustrated). The data side control signal Scd is supplied to the source driver 30 as the data side drive circuit, the scanning side control signal Scs is supplied to the gate driver 50 as the scanning signal line drive circuit, and the demultiplexing control signal Ssw is supplied to the demultiplexer circuit 40. As a result, the display control circuit 20 controls the demultiplexer circuit 40 in addition to controlling the source driver 30 and the gate driver 50. In this manner, in the present embodiment, a circuit controlling the demultiplexer circuit 40, in other words, demultiplexing control circuit is included in the display control circuit 20, but may be separated from the display control circuit 20, or may be provided in the source driver 30 or the gate driver 50.

The gate driver 50 generates scanning signals G1, G2, . . . , Gn for sequentially selecting n gate lines GL1, GL2, . . . , GLn based on the scanning side control signal Scs, and applies the scanning signals G1, G2, . . . , Gn to the n gate lines GL1, GL2, . . . , GLn, respectively. By driving the gate lines GL1 to GLn by the gate driver 50 in this manner, the n gate lines GL1 to GLn are sequentially selected for each one horizontal period, and the sequential selection of the n gate lines GL1 to GLn in this manner is repeated with one frame period as a cycle. Here, the term "horizontal period" refers to a period of a portion corresponding to one line of the display image in the image signal based on the horizontal scanning and the vertical scanning.

The data side control signal Scd supplied to the source driver 30 includes an image signal Sv representing an image to be displayed and a data side timing control signal Sct (e.g., a start pulse signal, and a clock signal). Based on the data side control signal Scd, the source driver 30 generates and outputs the data side output signals Do1 to Dom as the video signals at a timing corresponding to the driving of the gate lines GL1 to GLn by the application of the scanning signals G1 to Gn, and drives the source lines SLR1, SLG1, and SLB1 to SLRm, SLGm, and SLBm via the demultiplexer circuit 40 (details will be described later). In general, in a display device employing the SSD method, the source lines in the active matrix substrate 100 are grouped into a plurality of groups of source lines with two or more source lines as one group, and the source driver includes a plurality of output terminals respectively corresponding to the plurality of groups as output terminals for driving source lines. As illustrated in FIG. 2, in the present embodiment, 3 m source lines SLR1, SLG1, and SLB1 to SLRm, SLGm, and SLBm in the active matrix substrate 100 are grouped into m groups of source line groups (SLR1, SLG1, and SLB1), (SLR2, SLG2, and SLB2), . . . , (SLRm, SLGm, and SLBm) with three source lines SLRj, SLGj, and SLBj as one group. The source driver 30 as the data side drive circuit includes m output terminals To1 to Tom respectively corresponding to the m groups as output terminals for source line driving. The data side output signal Doj output from each output terminal Toj (j=1 to m) is a video signal (hereinafter, also referred to as "multiplexed data signal") in which data signals DRj, DGj, and DBj respectively to be applied to the three source lines SLRj, SLGj, and SLBj of the corresponding group are time-division multiplexed.

The demultiplexer circuit 40 receives the multiplexed data signals Do1 to Dom from the source driver 30, demultiplexes the multiplexed data signals Do1 to Dom based on the demultiplexing control signal Ssw and supplies the multiplexed signal as the 3 m data signals DR1, DG1, and DB1 to DRm, DGm, and DBm to the source lines SLR1, SLG1, and SLB1 to SLRm, SLGm, and SLBm, respectively.

As described above, the data signals DR1, DG1, and DB1 to DRm, DGm, and DBm are applied to the source lines SLR1, SLG1, and SLB1 to SLRm, SLGm, and SLBm, and the scanning signals G1 to Gn are applied to the gate lines GL1 to GLn. In addition, common voltage Vcom is supplied to the common electrode Ec from the display control circuit 20. By driving the source lines SLR1, SLG1, and SLB1 to SLRm, SLGm, and SLBm and gate lines GL1 to GLn in the display portion 101, pixel data based on the image signal Sv in the input signal Sin is written to each pixel circuit 10, and by irradiating the back face of the display portion 101 with light from the backlight (not illustrated), the image represented by the image signal Sv is displayed on the display portion 101.

1.2 Details of Configuration and Operation of the Demultiplexer Circuit

Figure 3:
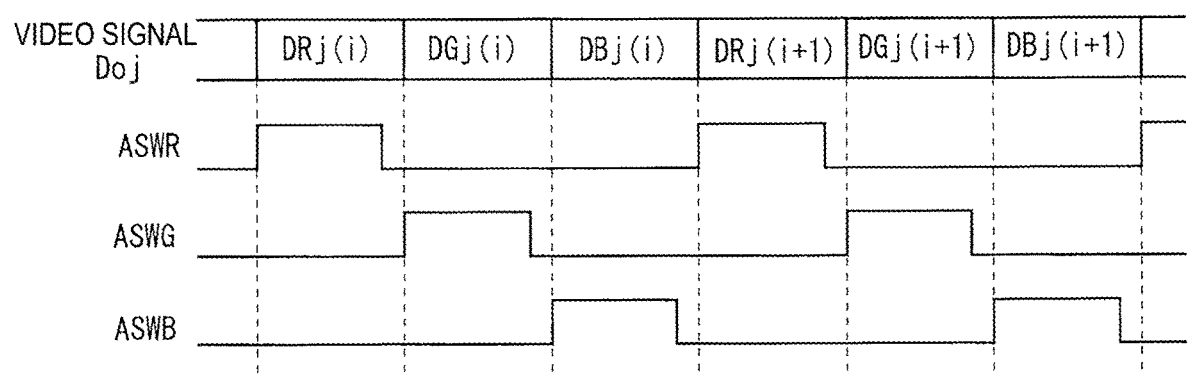
FIG. 3 is a timing chart for describing operations of the demultiplexer circuit in the first embodiment.

FIG. 3 is a timing chart for describing operations of the demultiplexer circuit 40 in the present embodiment. Hereinafter, the configuration and operations of the demultiplexer circuit 40 will be described in detail with reference to FIG. 3 in conjunction with above-described FIG. 2.

As illustrated in FIG. 2, the demultiplexer circuit 40 in the present embodiment includes m demultiplexers 411, 412, . . . , 41m respectively corresponding to the m groups of source line groups (SLR1, SLG1, and SLB1), (SLR2, SLG2, and SLB2), . . . , (SLRm, SLGm, and SLBm), and includes m input terminals Td1 to Tdm respectively corresponding to the m demultiplexers 411 to 41m. The m input terminals Td1 to Tdm are connected to m output terminals To1 to Tom of the source driver 30, respectively, via each of m data output lines as video signal lines, and the multiplexed data signals Do1 to Dom output from the source driver 30 are supplied to the input terminals Td1 to Tdm, respectively, of the demultiplexer circuit 40. Each demultiplexer 41j (j=1 to m) connects corresponding input terminal Tdj to any of the three source lines SLRj, SLGj, and SLBj of the corresponding group based on the demultiplexing control signal Ssw, and switches the source line connected to the input terminal Tdj among the three source lines SLRj, SLGj, and SLBj in each horizontal period. As a result, the multiplexed data signal Doj supplied to each input terminal Tdj of the demultiplexer circuit 40 is demultiplexed and is supplied, as the data signals DRj, DGj, and DBj, to the three source lines SLRj, SLGj, and SLBj, respectively, of the corresponding group.

As illustrated in FIG. 2, each demultiplexer 41j (j=1 to m) in the demultiplexer circuit 40 includes TFTs (hereinafter referred to as "connection control transistors") MRj, MGj, and MBj as three switching elements connected to the three source lines SLRj, SLGj, and SLBj, respectively, of the corresponding group. Hereinafter, in a case of distinguishing between the three source lines SLRj, SLGj, and SLBj, the source lines are respectively referred to as "R source line SLRj", "G source line SLGj", and "B source line SLBj", and in a case of distinguishing between the three connection control transistors MRj, MGj, and MBj, the source lines are respectively referred to as "R connection control transistor MRj", "G connection control transistor MGj", and "B connection control transistor MBj". The input terminal Tdj corresponding to the demultiplexer 41j among the m input terminals Td1 to Tdm is connected to the R source line SLRj via the R connection control transistor MRj, connected to the G source line SLGj via the G connection control transistor MGj, and connected to the B source line SLBj via the B connection control transistor MBj.

The demultiplexing control signal Ssw supplied to the demultiplexer circuit 40 includes an R control signal ASWR, a G control signal ASWG, and a B control signal ASWB as illustrated in FIG. 3, and three control signal lines for respectively transmitting the control signals ASWR, ASWG, and ASWB are arranged in the demultiplexer circuit 40. As illustrated in FIG. 2, the three control signal lines supply the R control signal ASWR, the G control signal ASWG, and the B control signal ASWB to the gate terminals of the R connection control transistor MRj, the G connection control transistor MGj, and the B connection control transistor MBj, respectively, in each demultiplexer 41j.

As described above, the data side output signal Doj as the video signal supplied from the source driver 30 to the input terminal Tdj corresponding to each demultiplexer 41j is a video signal in which the data signals DRj, DGj, and DBj to be applied to the three source lines SLRj, SLGj, and SLBj, respectively, of the corresponding group are time-division multiplexed, and a value switches for each ⅓ horizontal period as illustrated in FIG. 3. In FIG. 3, "DRj (i)" indicates pixel data to be written to the pixel circuit 10 connected to the j-th R source line SLRj and the i-th gate line GLi (hereinafter also referred to as "R pixel circuit P×R (i, j)" in the i-th row and the j-th column), "DGj (i)" indicates pixel data to be written to the pixel circuit 10 connected to the j-th G source line SLGj and the i-th gate line GLi (hereinafter also referred to as "G pixel circuit P×G (i, j)" in the i-th row and the j-th column), and "DBj (i)" indicates pixel data to be written to the pixel circuit 10 connected to the j-th B source line SLBj and the i-th gate line GLi (hereinafter also referred to as "B pixel circuit P×B (i, j)" in the i-th row and the j-th column).

In each demultiplexer 41j in the demultiplexer circuit 40 configured as described above, the R connection control transistor MRj, the G connection control transistor MGj, and the B connection control transistor MBj perform the on/off operation in accordance with the demultiplexing control signal Ssw (R control signal ASWR, G control signal ASWG, and B control signal ASWB) illustrated in FIG. 3. As a result, each of the multiplexed data signal Doj output from the source driver 30 is demultiplexed and supplied, as the three data signals DRj, DGj, and DBj, to the three source lines SLRj, SLGj, and SLBj, respectively, corresponding to the demultiplexer 41j.

In this manner, when the connection control transistor MXj connected to the source line SLXj to which a voltage is applied changes from the on state to the off state (X is either R, G, or B), each voltage of the three data signals DRj, DGj, and DBj supplied to the three source lines SLRj, SLGj, and SLBj, respectively, corresponding to each demultiplexers 41j is held in the source line SLXj (wiring line capacitance thereof).

As described above, the voltage of the data signal DXj supplied to and held in each source line SLXj (j=1 to m, X=R, G, and B) is written, as pixel data, in the pixel circuit P×X (i, j) in the i-th row and the j-th column connected to the gate line GLi (i is any one of 1 to n) in the selected state among the n gate lines GL1 to GLn and the source line SLXj. Specifically, the voltage of the data signal DXj supplied to and held in the source line SLXj is supplied to via the pixel TFT 11 and held in the pixel capacitance Cp in the pixel circuit PxX (i, j).

1.3 Layout of Demultiplexer Circuit

Figure 4:
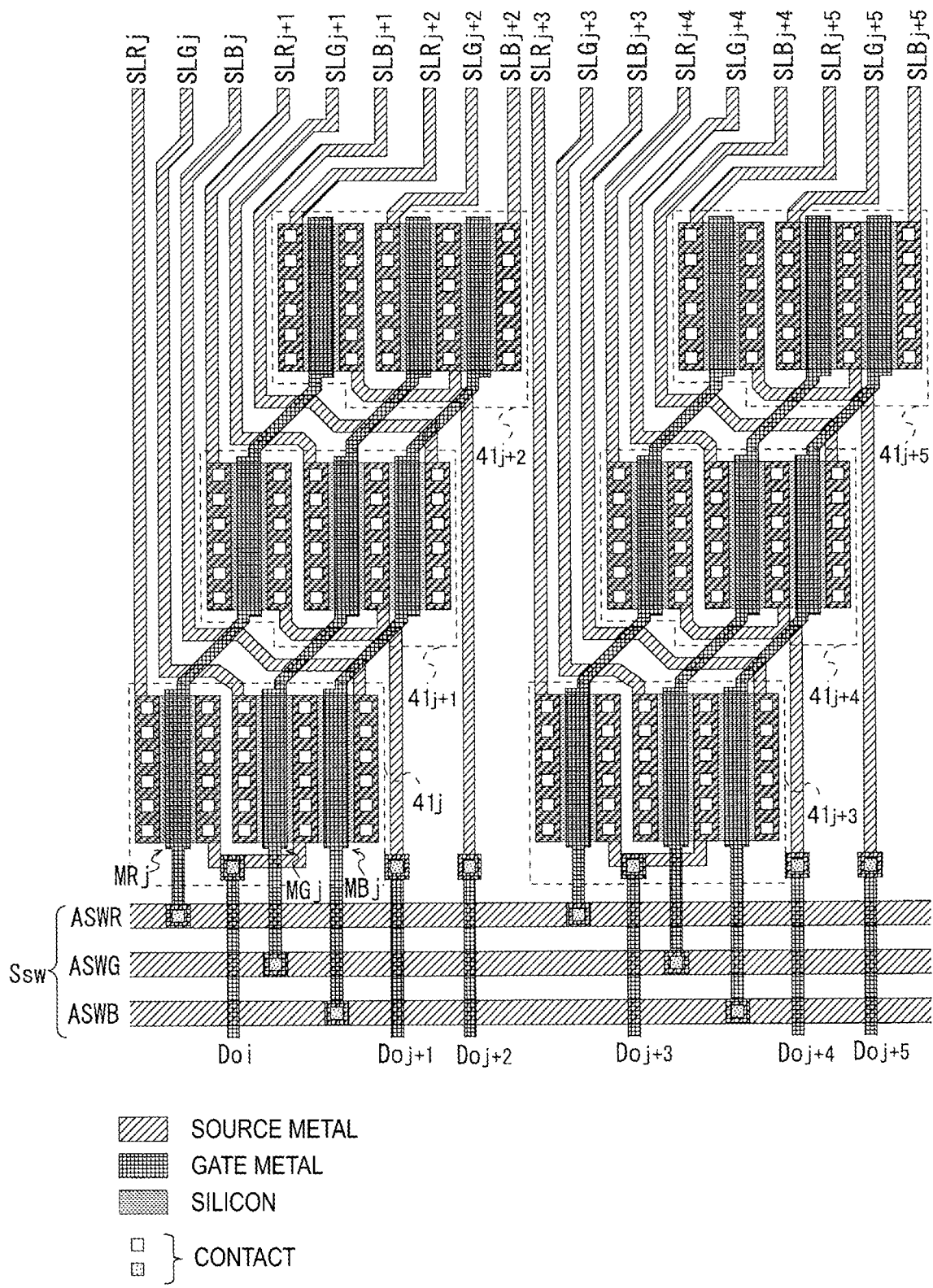
FIG. 4 is a layout diagram for describing a layout pattern of the demultiplexer circuit in a known active matrix display device (first known example) corresponding to the first embodiment.

As described above, in a case where the SSD method is employed in a display device having a narrow pixel pitch, the transistors constituting the demultiplexer circuit sometimes cannot be arranged in the vertical direction with respect to the source line as the data signal line on the active matrix substrate. In this case, a diagonal arrangement configuration as illustrated in FIG. 4 is employed. In a known active matrix display device employing the SSD method (hereinafter referred to as "first known example") employing the diagonal arrangement configuration, m demultiplexers 41_1_ to 41_m_ in the demultiplexer circuit 40 are grouped with adjacent three demultiplexers as one set, and nine connection control transistors included in the three demultiplexers in each set are arranged to be aligned in the extending direction of the source line with the three transistors included in one demultiplexer as a unit while positions of the nine connection control transistors are sequentially shifted in the vertical direction with respect to the source line.

In FIG. 4, both of hatched patterns extending in the generally vertical direction (the up and down direction in the drawing) and hatched patterns extending in the horizontal direction (the left and right direction in the drawing) indicate patterns of wiring lines formed of a metal material (referred to as "source metal") in a certain layer of the active matrix substrate 100, grid-like hatched patterns indicate patterns of wiring lines formed of a metal material (referred to as "gate metal") in another layer (the gate metal is also used for wiring lines of gate lines as scanning signal lines), and dot hatched patterns indicate patterns of regions formed of semiconductor material (referred to herein as "silicon") in yet another layer. In addition, small squares without hatching indicate contact holes for electrically conductive connection between the source metal patterns and the silicon patterns, and dot hatched small squares indicate contact holes for electrically conductive connection between the source metal patterns and the gate metal patterns.

As can be seen in FIG. 2, FIG. 4 indicates a layout pattern of nine transistors (TFTs) included in one set constituted by the j-th to the (j+2)-th demultiplexers 41_j_, 41_j+1_, and 41_j+2_, and nine transistors (TFTs) included in another set constituted by the (j+3)-th to the (j+5)-th demultiplexers 41_j+3_, 41_j+4_, and 41_j+5_. The j-th to the (j+5)-th multiplexed data signals Doj to Doj+5 as time-division multiplexed video signals are demultiplexed by the j-th to the (j+5)-th demultiplexers 41_j_ to 41_j+5_ in the two sets, and supplied, as the data signals DRj, DGj, and DBj to DRj+5, DGj+5, and DBj+5, to the source lines SLRj, SLGj, and SLBj to SLRj+5, SLGj+5, and SLBj+5, respectively. Note that the same applies to a layout pattern in the present embodiment illustrated in FIG. 6, which will be described later.

In FIG. 4, when attention is paid to the layout pattern (hereinafter referred to as the "path layout pattern") of the path in the demultiplexer circuit supplying the data signal DXj to each source line SLXj (j=1 to m, X=R, G, and B), the difference between the path layout patterns is relatively small for adjacent source lines in the same set. However, in a case where a demultiplexer to which one of the adjacent source lines is connected and a demultiplexer to which the other one of the adjacent source lines is connected are included in different sets, as the (j+2)-th B source line SLBj+2 and the (j+3)-th R source line SLRj+3, path layout patterns for the adjacent source lines are significantly different from each other, and the length of one source line (SLBj+2) and the length of the other source line (SLRj+3) are also significantly different. As a result, significant difference occurs between the charging rate when the one source line (SLBj+2) is charged with the data signal DBj+2 supplied thereto and the charging rate when the other source line (SLRj+3) is charged with the data signal DRj+3 supplied thereto. Hereinafter, the reason why such the significant difference in the charging rate occurs will be described with reference to FIG. 5. Note that the charging rate refers to the ratio Vsl/Vsl (ideal) of the voltage Vsl actually held in the source line SLXj with respect to the voltage Vsl (ideal) held in the source line SLXj in a case where the wiring line capacitance Csl of the source line SLXj is ideally charged by the data signal DXj supplied from the source driver 30 to each source line SLXj (j=1 to m, X=R, G, and B) via the demultiplexer circuit 40.

Figure 5:
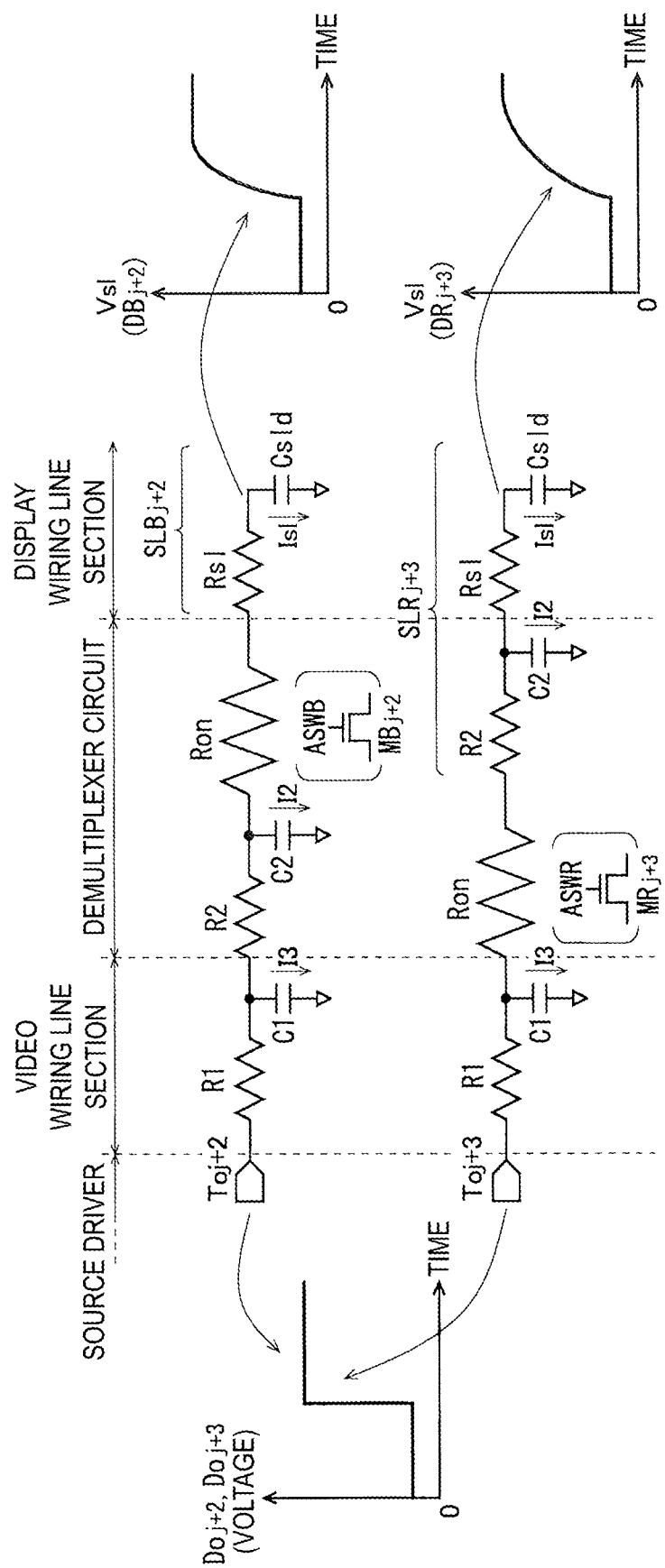
FIG. 5 is a circuit diagram for describing a problem in the first known example.

FIG. 5 indicates an equivalent circuit of a path (hereinafter referred to as "DBj+2 supply path") for supplying the data signal DBj+2 to the (j+2)-th B source line SLBj+2, and an equivalent circuit of a path (hereinafter referred to as "DRj+3 supply path") for supplying the data signal DRj+3 to the (j+3)-th R source line SLRj+3, and indicates a voltage waveform of signals Doj+2 and Doj+3 output from output terminals Toj+2 and Toj+3, respectively, of the source driver 30 corresponding to the starting points of the DBj+2 supply path and the DRj+3 supply path, respectively, and respective waveforms of voltages Vsl (DBj+2) and Vsl (DRj+3) at connection points of the source lines SLBj+2 and SLRj+3 corresponding to the end points of the DBj+2 supply path and the DRj+3 supply path, respectively (the connection point between the wiring line resistance Rsl and the wiring line capacitance Csl in the source line SLBj+2, and the connection point between the wiring line resistance Rsl and the wiring line capacitance Csl in the source line SLRj+3).

Note that, as illustrated in FIG. 5, in both the DBj+2 supply path and the DRj+3 supply path, a wiring line (hereinafter referred to as "video wiring line section") from the output terminal of the source driver 30 to the input terminal of the demultiplexer circuit 40 is represented by the wiring line resistance R1 and the wiring line capacitance C1, and a wiring line (hereinafter referred to as "display wiring line section") from the output terminal of the demultiplexer to the terminal end of the source line connected to the output terminal is represented by the wiring line resistance Rsl and the wiring line capacitance Csl. A path in the demultiplexer circuit 40 of the DBj+2 supply path is constituted by a wiring line of a source metal connected to the input terminal of the demultiplexer circuit 40 and the connection control transistor MBj+2 connected to the output terminal of the demultiplexer circuit 40, and a path in the demultiplexer circuit 40 of the DRj+3 supply path is constituted by the connection control transistor MRj+3 connected to an input terminal of the demultiplexer circuit 40 and a wiring line of a source metal connected to the output terminal of the demultiplexer circuit 40. In the equivalent circuits illustrated in FIG. 5, the connection control transistors MBj+2 and MRj+3 in the demultiplexer circuit 40 are both represented by the on resistance Ron, and the wiring lines of the source metal in the demultiplexer circuit 40 are both represented by the wiring line resistance R2 and the wiring line capacitance C2.

In a narrow sense, the source line SLXj (j=1 to m, X=R, G, and B) as the data signal line can be considered as a wiring line constituted by the source metal in the display portion 101. However, in the DRj+3 supply path as illustrated in FIG. 5, the wiring line of the source metal in the demultiplexer circuit 40 is directly connected to the wiring line of the source metal in the display portion 101. In this case, a wiring line constituted by the wiring line of the source metal in the display portion 101 and the wiring line of the source metal connected thereto in the demultiplexer circuit 40 can be considered as a source line. Thus, in the following, it is assumed that the source line SLXj also includes the wiring line of the source metal in the demultiplexer circuit 40 directly connected to the wiring line of the source metal in the display portion 101. Thus, as illustrated in FIG. 5, although the source line SLBj+2 corresponding to the DBj+2 supply path is represented by only the wiring line resistance Rsl and the wiring line capacitance Csl, the source line SLRj+3 corresponding to the DRj+3 supply path is represented as a circuit to which the wiring line resistances R2 and Rsl, and the wiring line capacitances C2 and Csl are connected as illustrated in FIG. 5. Thus, the source line SLBj+2 corresponding to the DBj+2 supply path is longer than the source line SLRj+3 corresponding to the DRj+3 supply path, and the wiring line load is large.

In the equivalent circuits of the DBj+2 supply path and the DRj+3 supply path described above (FIG. 5), the on resistance Ron of the connection control transistors MBj+2 and MRj+3 is significantly greater than that of the wiring line resistances R1, R2, and Rsl (the value of the on resistance Ron is typically from several times to tens of times the wiring line resistance value (R1+R2+Rsl)). On the other hand, as can be seen in FIG. 5, when the source line SLBj+2 is driven by the data side output signal Doj+2 that changes in a stepped shape, the current flowing in the connection control transistor MBj+2 (on resistance Ron) in the DBj+2 supply path includes only the current Isl for charging the wiring line capacitance Csl of the source metal of the display wiring line section. However, when the source line SLRj+3 is driven by the data side output signal Doj+3 that also changes in a stepped shape, the current flowing in the connection control transistor MRj+3 (on resistance Ron) in the DRj+3 supply path includes the current 12 for charging the wiring line capacitance C2 of the source metal in the demultiplexer circuit 40 in addition to the current Isl for charging the wiring line capacitance Csl of the source metal of the display wiring line section. Thus, the voltage drop in the connection control transistor MRj+3 (on resistance Ron) in the DRj+3 supply path is greater than the voltage drop in the connection control transistor MBj+2 (on resistance Ron) in the DBj+2 supply path. As a result, as illustrated in FIG. 5, the voltage (voltage of the data signal DRj+3) of the wiring line capacitance Csl of the source line (source metal) SLRj+3 of the display wiring line section connected to the DRj+3 supply path changes more slowly than the voltage (voltage of the data signal DBj+2) of the wiring line capacitance Csl of the source line (source metal) SLBj+2 of the display wiring line section connected to the DBj+2 supply path, and thus the charging rate of the wiring line capacitance Csl of the source line SLRj+3 is lower than the charging rate of the wiring line capacitance Csl of the source line SLBj+2.

Figure 7:
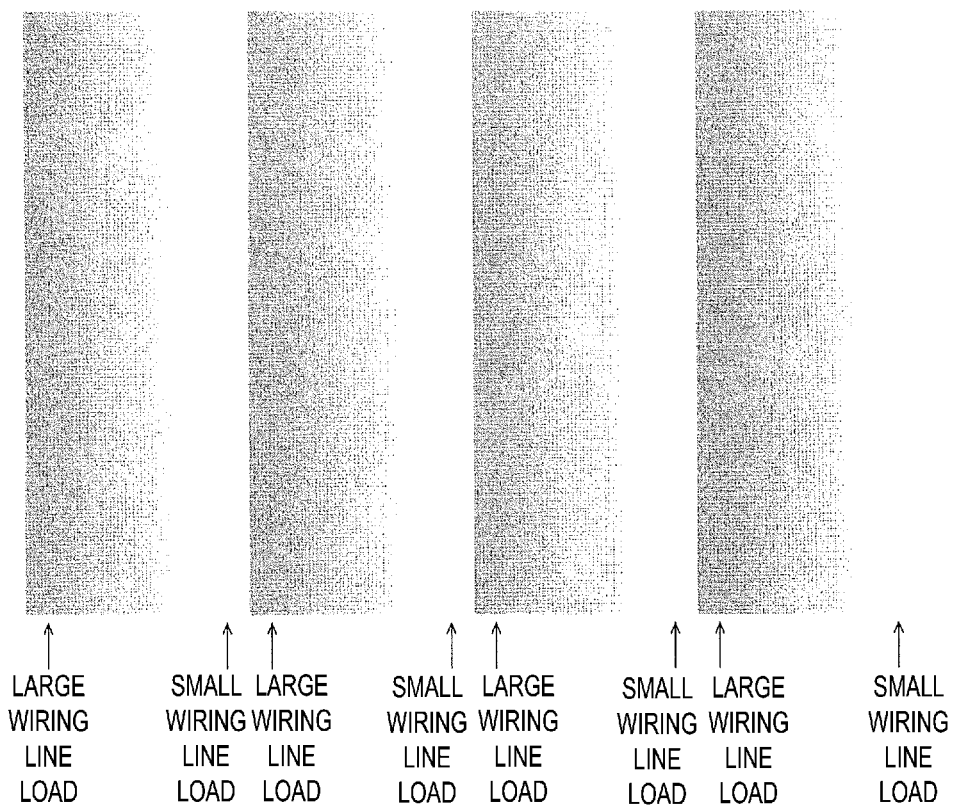
FIG. 7 is a diagram for describing a problem (occurrence of striped unevenness) in a case where a uniform gray levels display is performed in the first known example.

As described above, the layout pattern of the demultiplexer circuit 40 in the first known example includes a portion where two path layout patterns (in the demultiplexer circuit 40) corresponding to adjacent source lines are significantly different from each other, in other words, a portion where the shortest source line and the longest source line are adjacent to each other, and in the portion, source lines having significantly different wiring line loads are adjacent to each other. As a result, even if each source line is driven so that the entire screen is displayed in the same gray scale, the striped unevenness as illustrated in FIG. 7 may be visually recognized. In other words, when assuming regions of the display portion 101 corresponding to each set of the demultiplexer, a phenomenon occurs in which the luminance is significantly different at the boundaries of the regions, and this may be visually recognized as striped unevenness.

Figure 6:
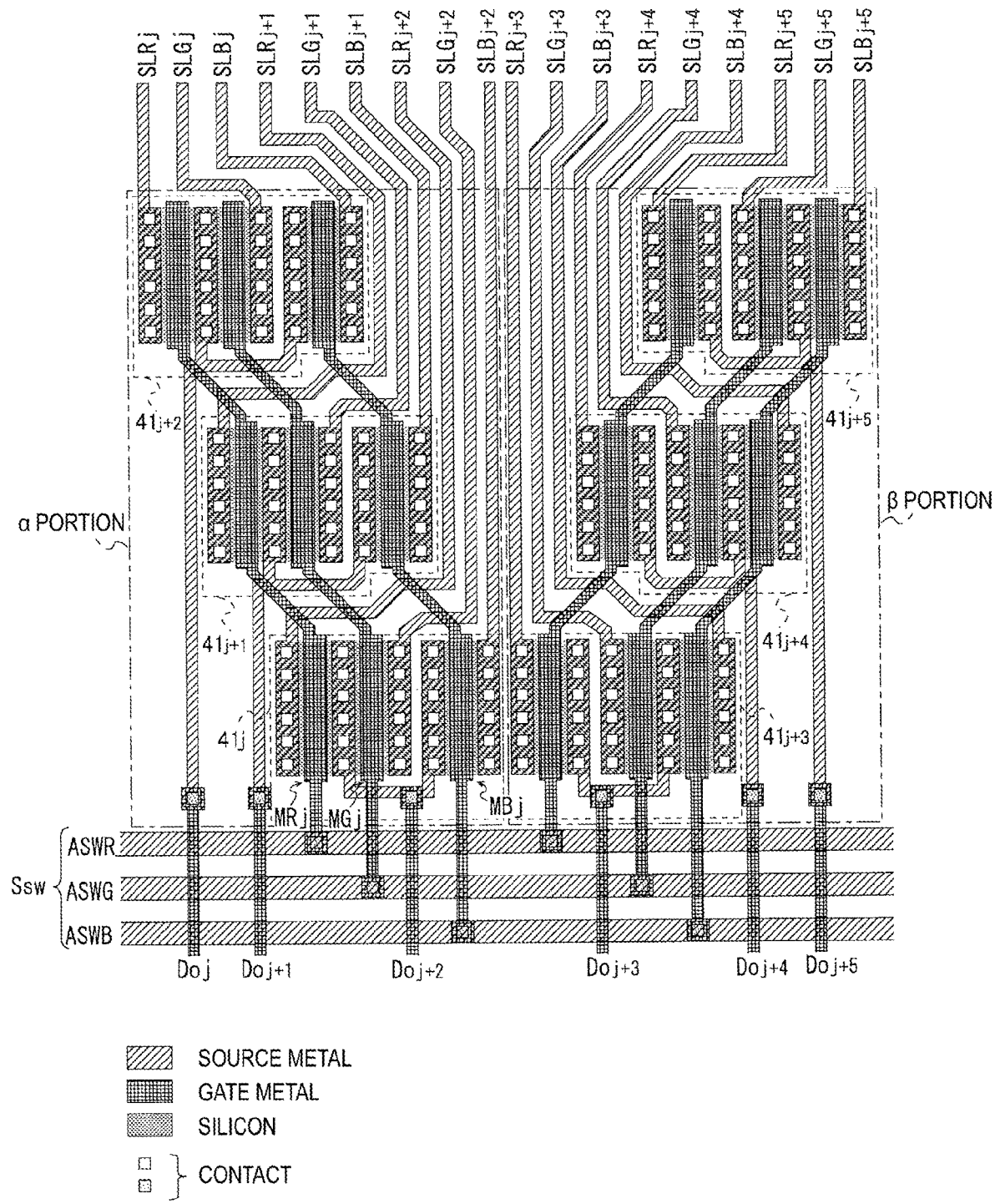
FIG. 6 is a layout diagram for describing a layout pattern of the demultiplexer circuit in the first embodiment.

In the present embodiment as well, the diagonal arrangement configuration is employed for the demultiplexer circuit 40, and m demultiplexers 411 to 41m are grouped with adjacent three demultiplexers as one set, and nine connection control transistors included in the three demultiplexers in each set are arranged to be aligned in the extending direction of the source line with the three transistors included in the one demultiplexer as a unit while positions of the nine connection control transistors are sequentially shifted in the vertical direction with respect to the source line. However, unlike the layout pattern (FIG. 4) of the demultiplexer circuit 40 in the first known example, in the present embodiment, a layout pattern as illustrated in FIG. 6 is employed for the demultiplexer circuit 40 in order to suppress the occurrence of the striped unevenness as illustrated in FIG. 7. In other words, in any two adjacent sets, a direction in which nine transistors included in the three demultiplexers in one set are shifted in the vertical direction with respect to the source line with the three transistors as a unit and a direction in which nine transistors included in the three demultiplexers in the other set are shifted in the vertical direction with respect to the source line with the three transistors as a unit are opposite to each other (hereinafter, the configuration of such layout pattern is referred to as the "diagonal arrangement configuration of alternately reversing shift direction").

According to the present embodiment, since the layout pattern of the demultiplexer circuit 40 is configured to be the diagonal arrangement configuration of alternately reversing shift direction as illustrated in FIG. 6, although the lengths of the source lines SLXj (j=1 to m, X=R, G, and B) are different from each other, the difference between path layout patterns corresponding to any adjacent source lines are relatively small, and the lengths of the adjacent source lines will not be significantly different from each other. Thus, no significant difference in the charging rate occurs between the adjacent source lines when they are driven. As a result, occurrence of the striped unevenness that may occur in the first known example is suppressed, and in a case where each source line is driven so that the entire screen is displayed in the same gray scale, a display (luminance distribution) as illustrated in FIG. 8 is obtained, and the striped unevenness is not visually recognized.

1.4 Effect

Figure 8:
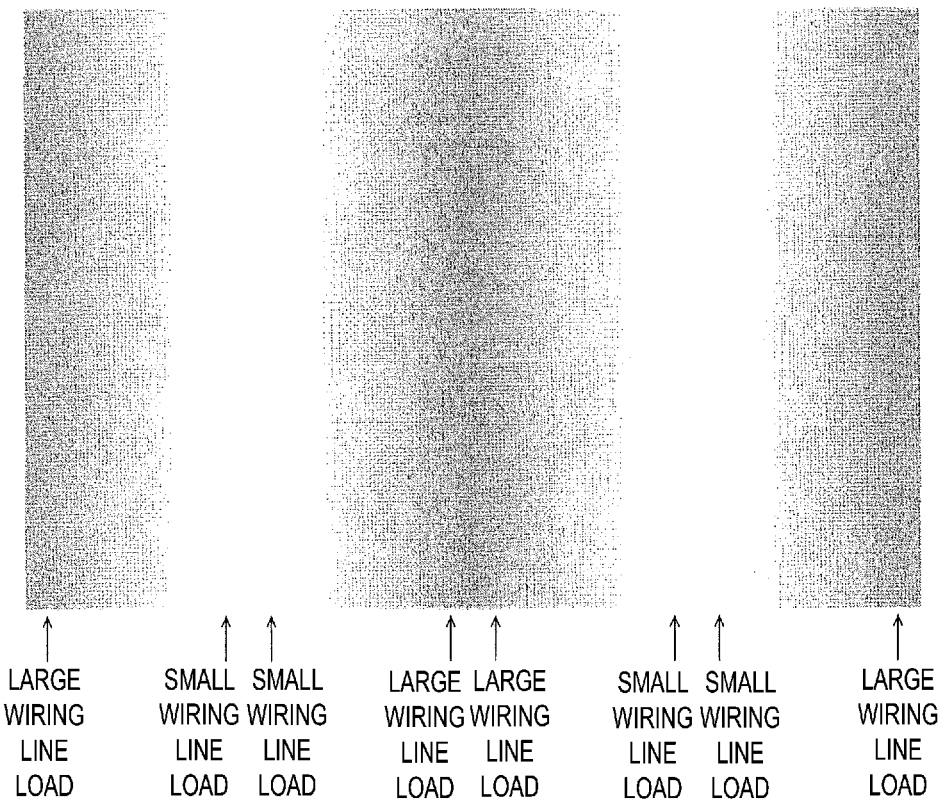
FIG. 8 is a circuit diagram for describing operations and effects in a case where a uniform gray levels display is performed in the first embodiment.

As described above, according to the present embodiment, since the layout pattern of the demultiplexer circuit 40 is configured to be the diagonal arrangement configuration of alternately reversing shift direction as illustrated in FIG. 6, in a display device such as HDM having a narrow pixel pitch, the occurrence of the striped unevenness (FIG. 7) can be suppressed while the demultiplexer circuit is formed integrally with the pixel circuit on the active matrix substrate (see FIG. 8).

1.5 Modified Example of First Embodiment

In the diagonal arrangement configuration of alternately reversing shift direction in the above-described embodiment, the demultiplexers 411 to 41m in the demultiplexer circuit 40 are grouped with three demultiplexers as one set, and nine connection control transistors included in the three demultiplexers in each set are arranged to be aligned in the extending direction of the source line with the three transistors included in the one demultiplexer as a unit while positions of the nine connection control transistors are sequentially shifted in the vertical direction with respect to the source line (see FIG. 6). However, instead, one or a plurality of demultiplexers other than three may be grouped as one set, and according to the grouping, the transistors included in the one set may be arranged to be aligned in the extending direction of the source line with one or a plurality of transistors as a unit while positions of the transistors are sequentially shifted in the vertical direction with respect to the source line. The same applies to other embodiments such as a second embodiment described later.

Figure 9:
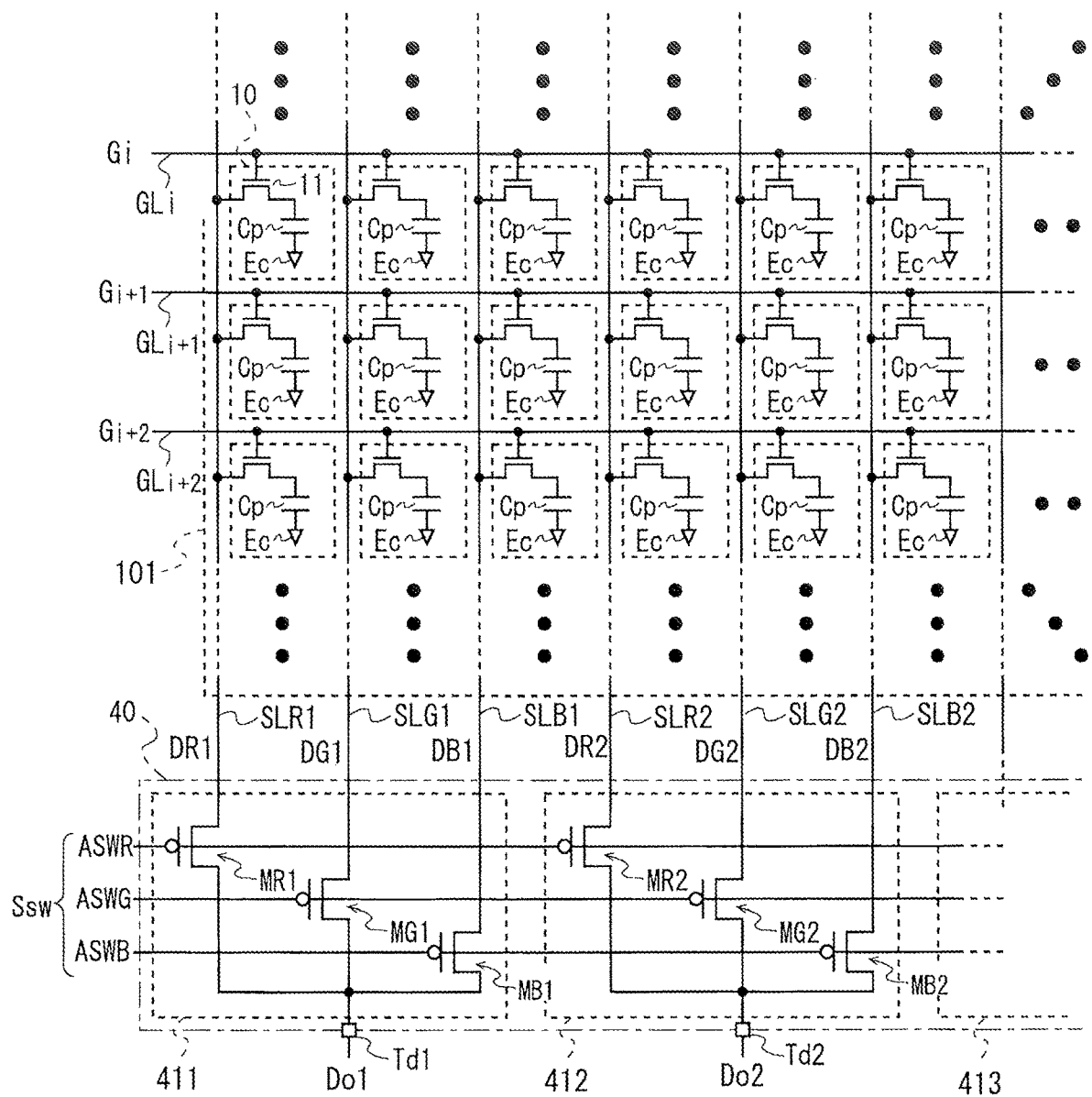
FIG. 9 is a circuit diagram illustrating a configuration of a demultiplexer circuit along with an electrical configuration of a display portion in the modified example of the first embodiment.

In addition, as the switching elements in the demultiplexer circuit 40 in the above-described embodiment, in other words, as the switching elements for demultiplexing the multiplexed data signal Doj, N-channel transistors MRj, MGj, and MBj are used. However, instead of this, P-channel transistors MRj, MGj, and MBj may be used as shown in FIG. 9 (j=1 to m). The same applies to the second embodiment, which will be described later.

Figure 10:
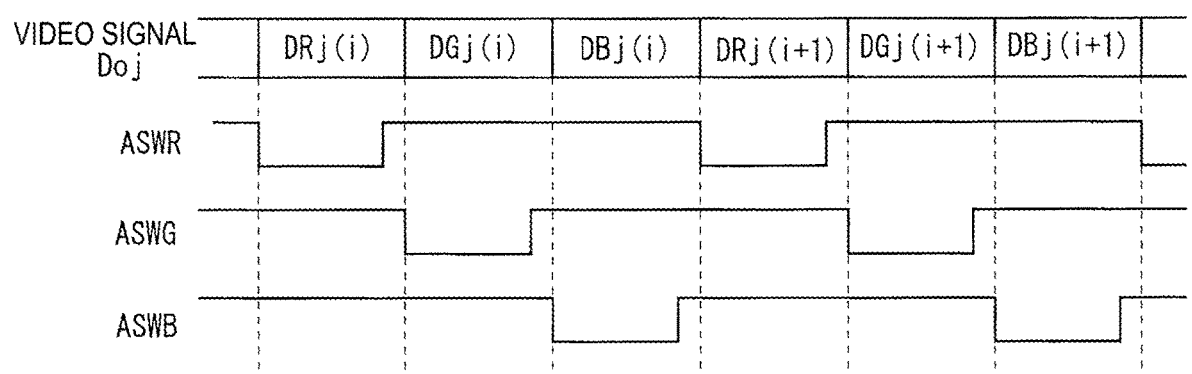
FIG. 10 is a timing chart for describing operations of the demultiplexer circuit in the modified example of the first embodiment.

FIG. 9 is a circuit diagram illustrating a configuration of a demultiplexer circuit 40 along with an electrical configuration of a display portion 101 in the modified example of the first embodiment. In the modified example, P-channel transistors are used as the switching elements in the demultiplexer circuit 40, and thus, as the demultiplexing control signal Ssw to be supplied to the demultiplexer circuit 40, instead of the R control signal ASWR, the G control signal ASWG, and the B control signal ASWB illustrated in FIG. 3, the R control signal ASWR, the G control signal ASWG, and the B control signal ASWB illustrated in FIG. 10 are generated by the display control circuit 20.

2. Second Embodiment

Next, liquid crystal display device employing the SSD method (hereinafter referred to as "display device of the second embodiment") including an active matrix substrate 100 according to a second embodiment will be described. The overall configuration of the display device according to the second embodiment is substantially the same as the display device of the first embodiment (see FIG. 1) except for the configuration of the source line and the configuration of the demultiplexer circuit 40, and the same reference signs are assigned to the same or corresponding components and detailed descriptions of those components will be omitted.

Figure 11:
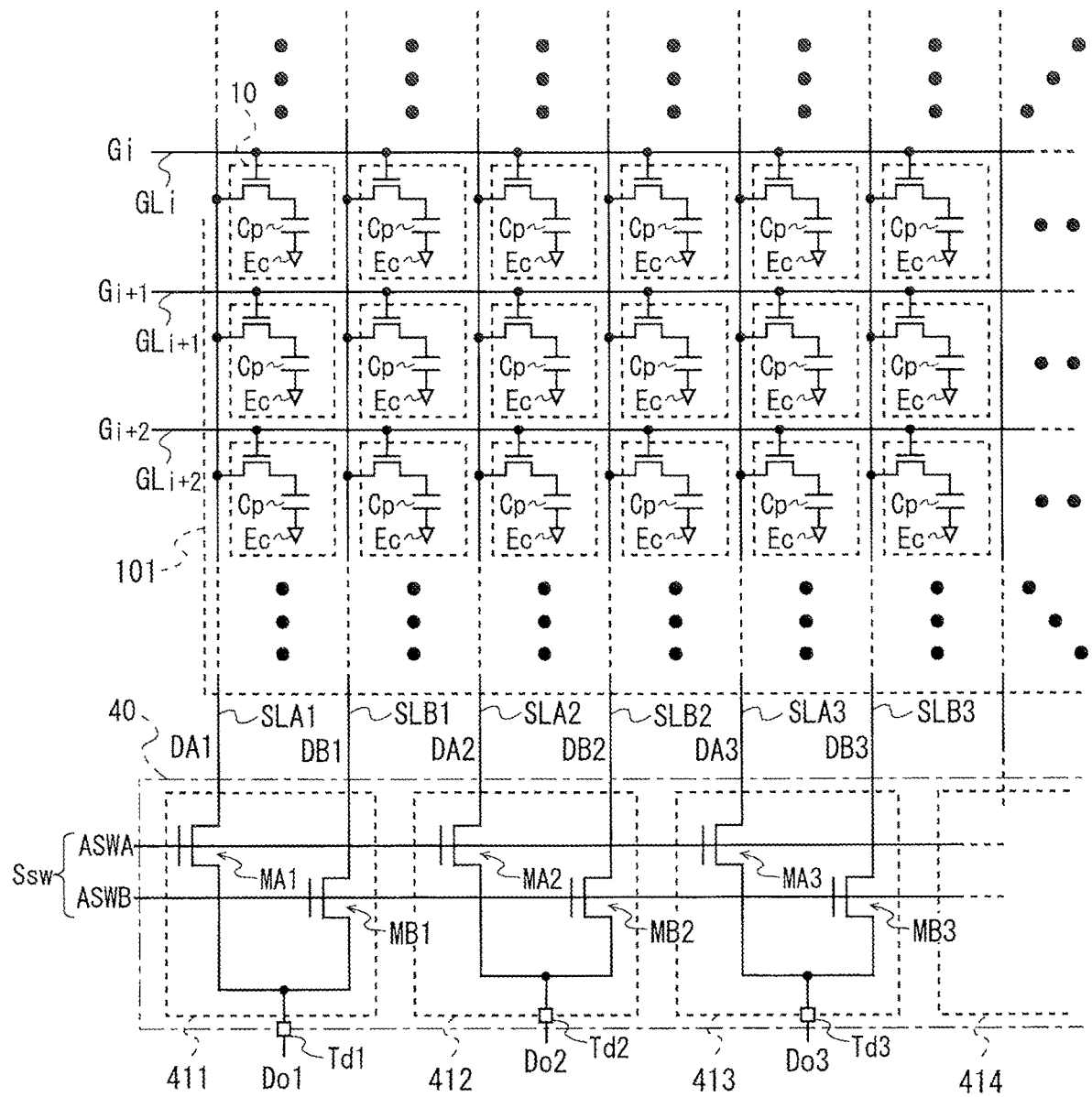
FIG. 11 is a circuit diagram illustrating a configuration of a demultiplexer circuit along with an electrical configuration of a display portion in a second embodiment.

FIG. 11 is a circuit diagram illustrating a configuration of the demultiplexer circuit 40 in the active matrix substrate 100 according to the present embodiment along with an electrical configuration of the display portion 101. As illustrated in FIG. 11, in the display portion 101 of the active matrix substrate 100, m groups of source line groups (SLA1 and SLB1) to (SLAm and SLBm) with two source lines SLAj and SLBj as one group, in other words, 2 m source lines SLA1 and SLB1 to SLAm and SLBm, as data signal lines, a plurality of (n) gate lines GL1 to GLn as scanning signal lines, and a plurality of (n×2 m) pixel circuits 10 arranged in a matrix along the source lines SLA1 and SLB1 to SLAm and SLBm and the gate lines GL1 to GLn are arranged.

Each pixel circuit 10 corresponds to any one of the source lines SLA1 and SLB1 to SLAm and SLBm, corresponds to any one of the gate lines GL1 to GLn, and is connected to a corresponding gate line GLi and a source line SLXi (i=1 to n, j=1 to m, X=R and B).

The configuration of each pixel circuit 10 is the same as that of the pixel circuit 10 in the first embodiment (see FIG. 2), and thus, the description thereof will be omitted. The configuration of the display control circuit 20, the source driver 30 as the data side drive circuit, and the gate driver 50 as the scanning signal line drive circuit are substantially the same as the display control circuit 20, the source driver 30, and the gate driver 50 in the first embodiment (see FIG. 2). However, the demultiplexers 41j in the above-described first embodiment is configured to demultiplex the multiplexed data signal Doj that is time-division multiplexed with a multiplicity of three, whereas the demultiplexers 41j in the present embodiment is configured to demultiplex the multiplexed data signal Doj that is time-division multiplexed with a multiplicity of two. Accordingly, the specific configurations of the display control circuit 20 and the source driver 30 are slightly different from that of the display control circuit 20 and the source driver 30 in the first embodiment. The differences will be described below together with the demultiplexer circuit 40 according to the present embodiment.

As illustrated in FIG. 11, in the present embodiment, the source driver 30 includes output terminals To1 to Tom corresponding to demultiplexers 411 to 41m, respectively, the demultiplexers 411 to 41m correspond to source line groups (SLA1 and SLB1) to (SLAm and SLBm), respectively, input terminal of each demultiplexer 41j is connected to a corresponding output terminal Toj of the source driver 30, and (two) output terminals of each demultiplexers 41j are respectively connected to source lines SLAj and SLBj constituting source line groups of the corresponding group (j=1 to m).

Figure 12:
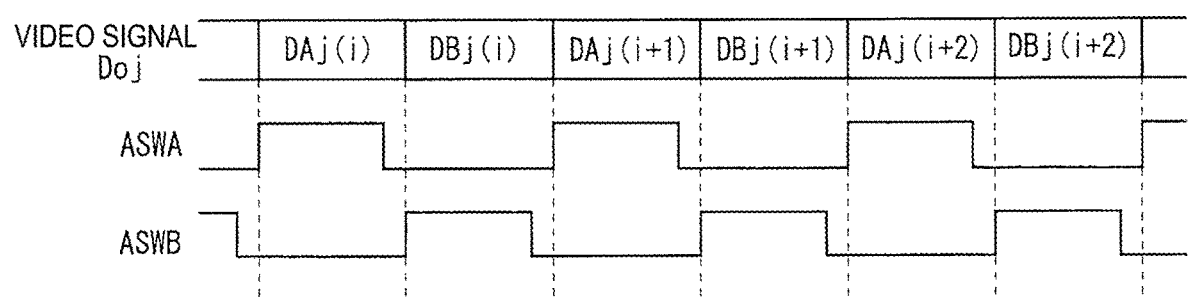
FIG. 12 is a timing chart for describing operations of the demultiplexer circuit in the second embodiment.

In the display device according to the present embodiment, as illustrated in FIG. 11 and FIG. 12, the source driver 30 outputs, from each output terminal Toj, a video signal as the multiplexed data signal Doj in which the data signals DAj and DBj to be applied to the source lines SLAj and SLBj, respectively, connected to the corresponding demultiplexer 41j are time-division multiplexed.

Each demultiplexer 41j in the present embodiment includes TFTs (hereinafter referred to as "connection control transistors") MAj and MBj as two switching elements connected to the two source lines SLAj and SLBj, respectively, of a corresponding group. Hereinafter, in a case of distinguishing between the two source lines SLAj and SLBj, the two source lines are referred to as "A source line SLAj" and "B source line SLBj", respectively, and in a case of distinguishing between the two connection control transistors MAj and MBj, each is referred to as "A connection control transistor MAj" and "B connection control transistor MBj", respectively. The input terminal Tdj of each demultiplexer 41j is connected to the A source line SLAj via the A connection control transistor MAj, and is connected to the B source line SLBj via the B connection control transistor MBj. Each demultiplexer 41j receives the multiplexed data signal Doj from the corresponding output terminal Toj of the source driver 30, demultiplexes the multiplexed data signal Doj based on the demultiplexing control signal Ssw, and supplies thereof as the two data signals DAj and DBj to the source lines SLAj and SLBj, respectively (j=1 to m). The display control circuit 20 generates control signals ASWA and ASWB as illustrated in FIG. 12 as the demultiplexing control signal Ssw.

As described above, the data signals DA1 and DB1 to DAm and DBm are applied to the source lines SLA1 and SLB1 to SLAm and SLBm, and the scanning signals G1 to Gn are applied to the gate lines GL1 to GLn. In addition, common voltage Vcom is supplied to the common electrode Ec from the display control circuit 20. By driving the source lines SLA1 and SLB1 to SLAm and SLBm and gate lines GL1 to GLn in the display portion 101, pixel data based on the image signal Sv in the input signal Sin is written to each pixel circuit 10, and by irradiating the back face of the display portion 101 with light from the backlight (not illustrated), the image represented by the image signal Sv is displayed on the display portion 101. Note that, details of the configuration and operations of each pixel circuit 10 are substantially the same as that of the pixel circuit 10 in the first embodiment, and thus, the description thereof will be omitted.

Figure 13:
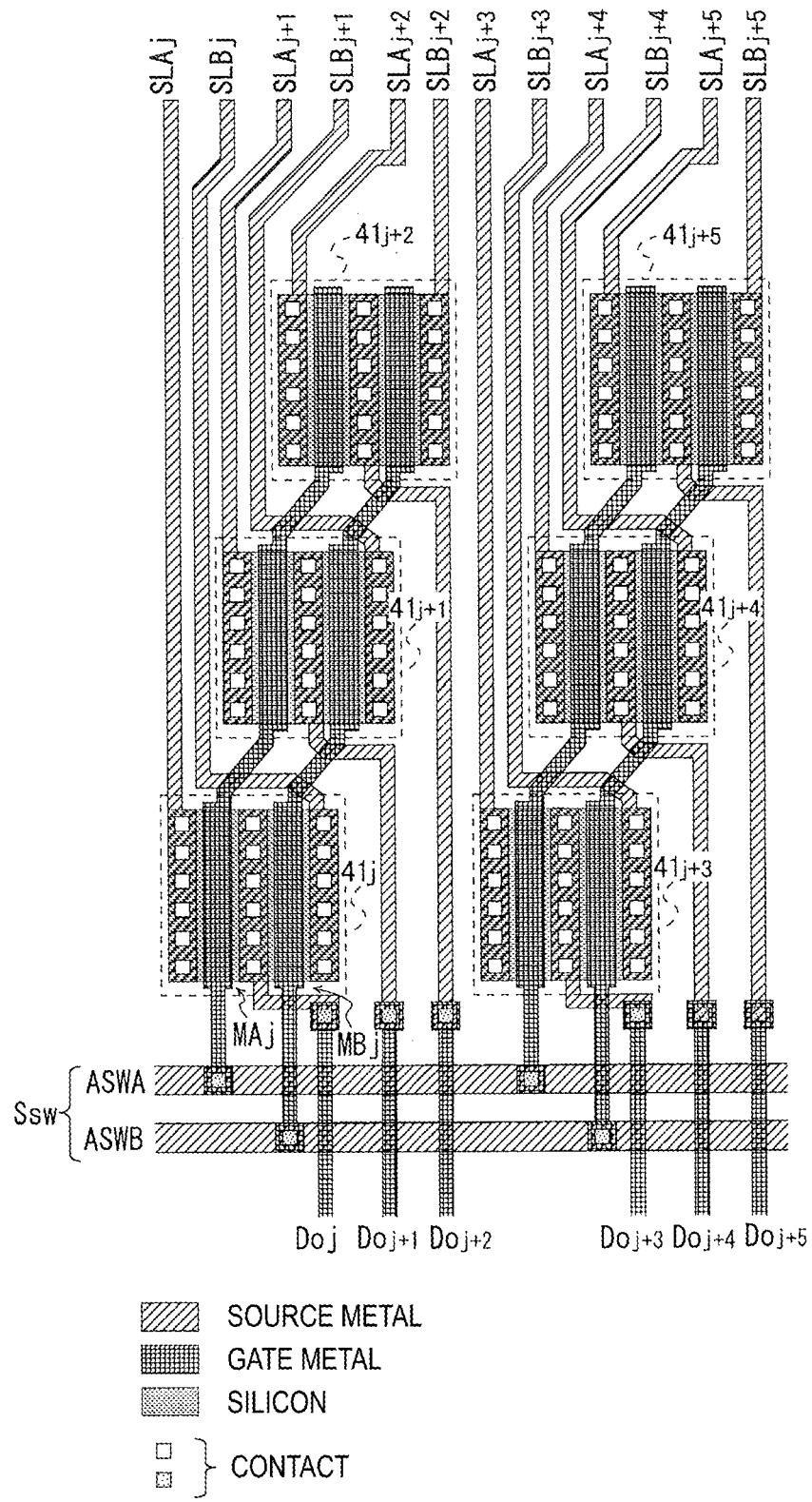
FIG. 13 is a layout diagram for describing a layout pattern of the demultiplexer circuit in a known active matrix display device (second known example) corresponding to the second embodiment.

FIG. 13 is a layout diagram for describing a layout pattern of the demultiplexer circuit 40 in a known active matrix display device employing the SSD method (hereinafter referred to as "second known example") including a configuration similar to those described above. In the second known example as well, m demultiplexers 411 to 41m in the demultiplexer circuit 40 are grouped with adjacent three demultiplexers as one set, and six connection control transistors included in the three demultiplexers in each set are arranged to be aligned in the extending direction of the source line with the two transistors included in the one demultiplexer as a unit while positions of the six connection control transistors are sequentially shifted in the vertical direction with respect to the source line. FIG. 13 indicates a layout pattern of six transistors included in one set constituted by the j-th to the (j+2)-th demultiplexers 41j, 41j+1, and 41j+2, and six transistors included in another set constituted by the (j+3)-th to the (j+5)-th demultiplexers 41j+3, 41j+4, and 41j+5. The j-th to the (j+5)-th multiplexed data signals Doj to Doj+5 as time-division multiplexed video signals are demultiplexed by the j-th to the (j+5)-th demultiplexers 41j to 41j+5 in the two sets, and is supplied, as the data signals DAj and DBj to DAj+5 and DBj+5, to the source lines SLAj and SLBj to SLAj+5 and SLBj+5, respectively. Note that, the same applies to the layout pattern of the present embodiment illustrated in FIG. 14, which will be described later.

In FIG. 13, when attention is paid to the layout pattern (path layout pattern) of the path in the demultiplexer circuit supplying the data signal DXj to each source line SLXj (j=1 to m, X=A and B), the difference between the path layout patterns is relatively small for adjacent source lines in the same set. However, in a case where a demultiplexer to which one of the adjacent source lines is connected and a demultiplexer to which the other is connected are included in different sets, as the (j+2)-th B source line SLBj+2 and the (j+3)-th A source line SLAj+3, path layout patterns for the adjacent source lines are significantly different, and the length of one source line (SLBj+2) and the length of the other source line (SLAj+3) are also significantly different. As a result, significant difference occurs between the charging rate when the one source line (SLBj+2) is charged with a voltage of the data signal DBj+2 supplied thereto and the charging rate when the other source line (SLRj+3) is charged with a voltage of the data signal DRj+3 supplied thereto. Thus, in the second known example as well, similar to the first known example described above, even if each source line is driven so that the entire screen is displayed in the same gray scale, the striped unevenness as illustrated in FIG. 7 may be visually recognized.

Figure 14:
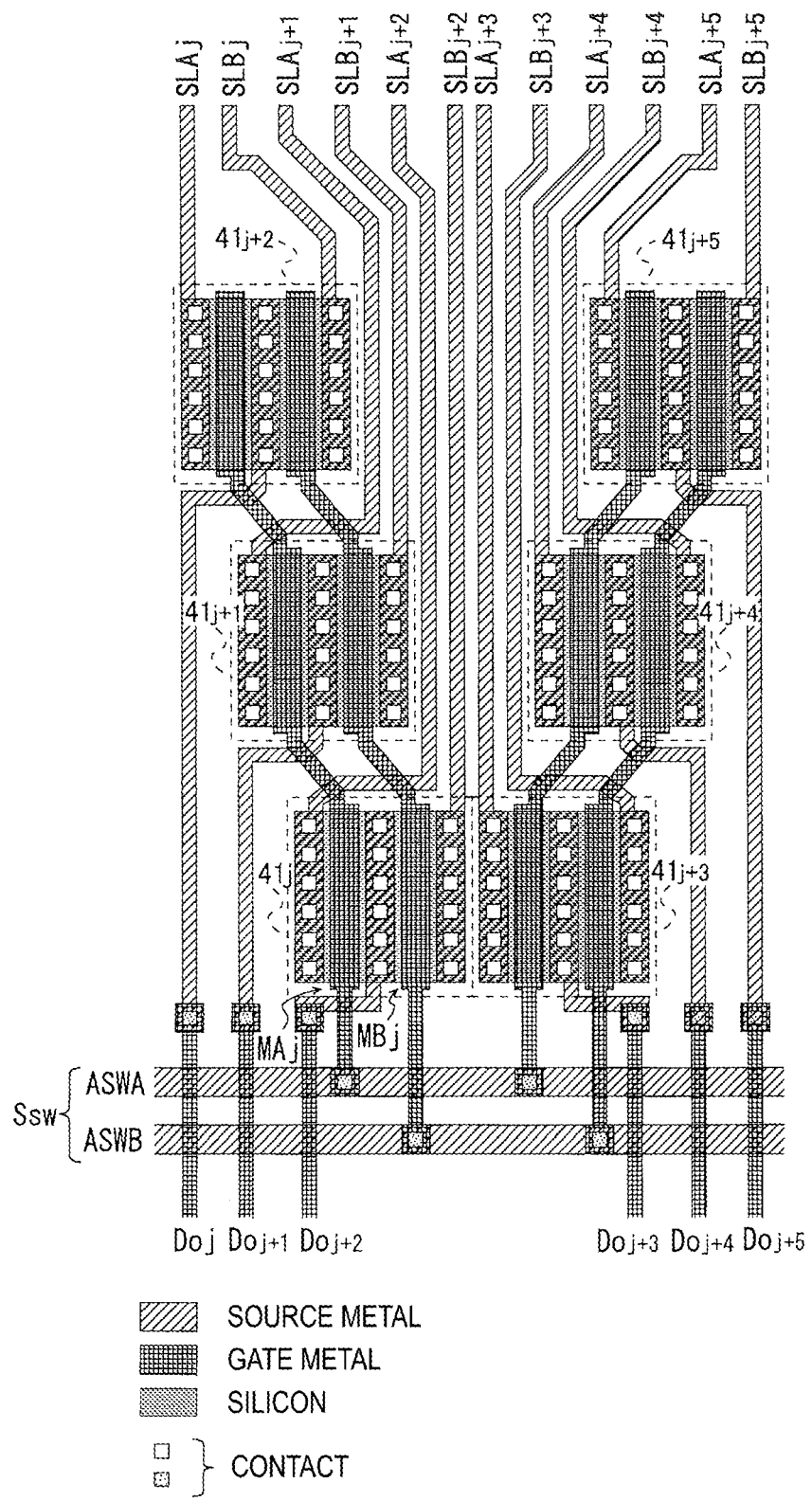
FIG. 14 is a layout diagram for describing a layout pattern of the demultiplexer circuit in the second embodiment.

In contrast, in the present embodiment, a layout pattern as illustrated in FIG. 7 is employed for the demultiplexer circuit 40 in order to suppress the occurrence of the striped unevenness as illustrated in FIG. 14. In other words, similar to the above-described second known example (FIG. 13), six connection control transistors in one set are arranged to be aligned in the extending direction of the source line with two transistors included in one demultiplexer as a unit while positions of the six transistors are sequentially shifted in the vertical direction with respect to the source line. However, unlike the second known example, in any two adjacent sets, a direction in which six transistors included in the three demultiplexers in one set are shifted in the vertical direction with respect to the source line with the two transistors as a unit and a direction in which six transistors included in the three demultiplexers in the other set are shifted in the vertical direction with respect to the source line with the two transistors as a unit are opposite to each other. In other words, the layout pattern of the demultiplexer circuit 40 is the same as that of the first embodiment (FIG. 6), and is configured to be the diagonal arrangement configuration of alternately reversing shift direction.

According to the present embodiment, although the lengths of the source lines SLXj (j=1 to m, X=A and B) are different, the difference between path layout patterns corresponding to any adjacent source lines are relatively small, and the lengths of the adjacent source lines will not be significantly different from each other. Thus, no significant difference in the charging rate occurs between the adjacent source lines when they are driven. As a result, in a display device in which the layout pattern of the demultiplexer circuit is configured to be the diagonal position configuration in order to correspond to a narrow pixel pitch, occurrence of the striped unevenness as illustrated in FIG. 7 is suppressed, and in a case where each source line is driven so that the entire screen is displayed in the same gray scale, a display as illustrated in FIG. 8 (luminance distribution) is obtained, and the striped unevenness is not visually recognized.

3. Third Embodiment

Next, liquid crystal display device employing the SSD method (hereinafter referred to as "display device of a third embodiment") including an active matrix substrate 100 according to the third embodiment will be described. The overall configuration of the display device according to the third embodiment is substantially the same as the display device of the second embodiment (see FIG. 11 and FIG. 12) except for the configuration of the demultiplexer circuit 40, and the same reference signs are assigned to the same or corresponding components and detailed descriptions of those components will be omitted.

Figure 15:
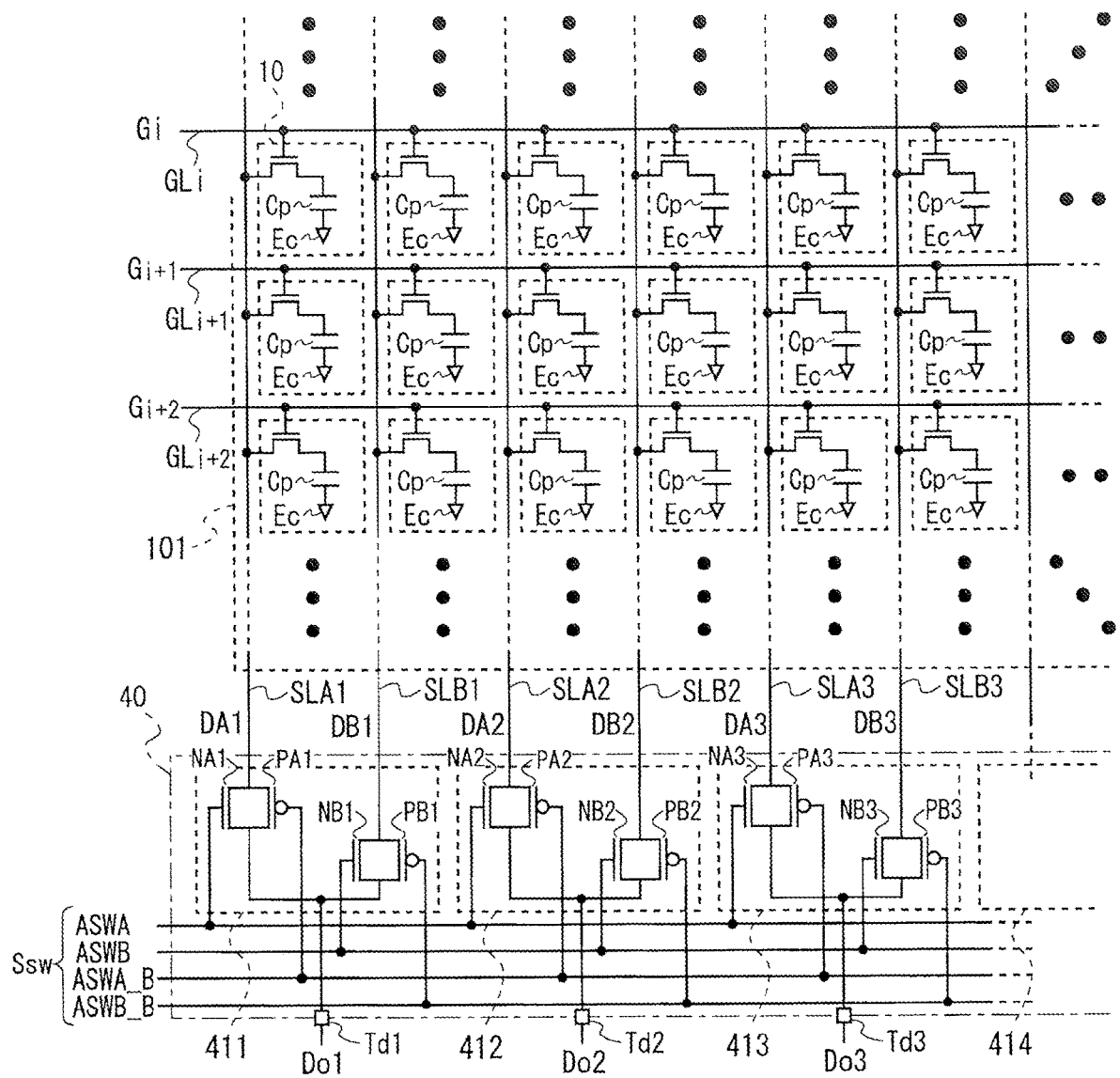
FIG. 15 is a circuit diagram illustrating a configuration of a demultiplexer circuit along with an electrical configuration of a display portion in a third embodiment.

FIG. 15 is a circuit diagram illustrating a configuration of the demultiplexer circuit 40 in the active matrix substrate 100 according to the present embodiment along with an electrical configuration of the display portion 101. As illustrated in FIG. 15, in the present embodiment as well, similar to the above-described second embodiment (FIG. 11), each demultiplexer 41j in the demultiplexer circuit 40 includes two switching elements, and is configured to demultiplex the multiplexed data signal Doj that is time-division multiplexed with a multiplicity of two. However, while the switching elements included in each demultiplexer 41j in the second embodiment are realized by N-channel transistors, each switching element included in each demultiplexers 41j in the present embodiment is realized as a circuit, in which an N-channel transistor and a P-channel transistor are connected in parallel with each other. in other words, as a CMOS transmission gate. In other words, in each demultiplexer 41j according to the above-described second embodiment, two switching elements are respectively realized by the N-channel transistors MA1 and MB1, whereas in each demultiplexer 41j according to the present embodiment, the two switching elements are realized by a first CMOS transmission gate constituted by an N-channel transistor NAj and a P-channel transistor PAj connected in parallel with each other and a second CMOS transmission gate constituted by an N-channel transistor NBj and a P-channel transistor PBj connected in parallel with each other (j=1 to m).

Figure 16:
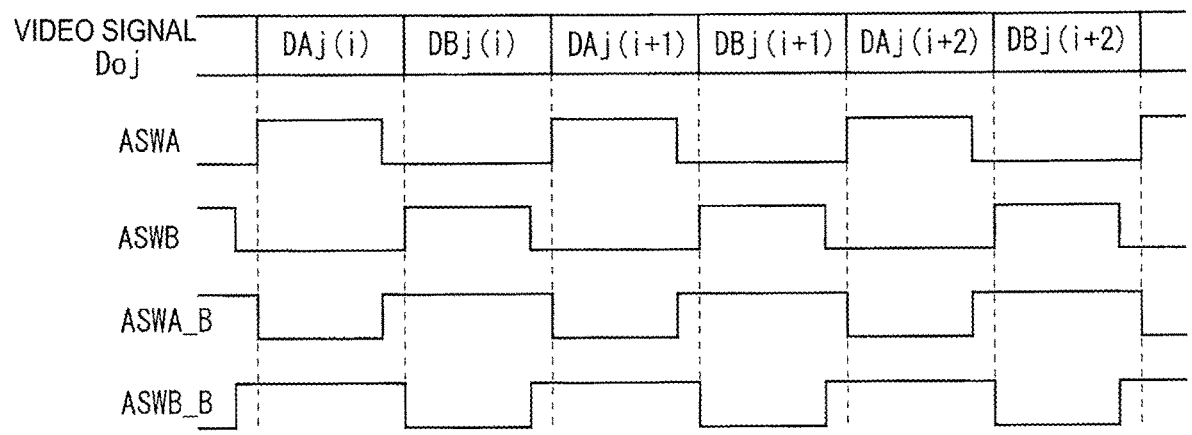
FIG. 16 is a timing chart for describing operations of the demultiplexer circuit in the third embodiment.

As a signal for controlling each demultiplexer 41j, a demultiplexing control signal Ssw constituted by control signals ASWA, ASWB, ASWA_B, and ASWB_B as illustrated in FIG. 16 (hereinafter, in a case where these control signals are distinguished from each other, respectively referred to as "A control signal ASWA", "B control signal ASWB", "A inversion control signal ASWA_B", and "B inversion control signal ASWB_B") is generated by the display control circuit 20. Here, the A inversion control signal ASWA_B and the B inversion control signal ASWB_B are logical inversion signals of the A control signal ASWA and the B control signal ASWB, respectively. As illustrated in FIG. 15, in each demultiplexer 41j, gate terminals of an N-channel transistor NAj and a P-channel transistor PAj constituting the first CMOS transmission gate are supplied with the A control signal ASWA and the A inversion control signal ASWA_B, respectively, and gate terminals of an N-channel transistor NBj and a P-channel transistor PBj constituting the second CMOS transmission gate are supplied with the B control signal ASWB and the B inversion control signal ASWB_B. respectively.

The display device according to the present embodiment in which the demultiplexers 411 to 41m described above are used also operates similarly to the display device according to the second embodiment. However, since each switching element included in each demultiplexer 41j is realized by the CMOS transmission gate in the present embodiment, the on resistance Ron of the switching element is smaller than the on resistance Ron of each switching element included in each demultiplexer 41j in the second embodiment. As a result, compared to the second embodiment, the difference in the charging rate between adjacent source lines is reduced (see FIG. 5), and the defect on the display (occurrence of the striped unevenness) as illustrated in FIG. 7 is alleviated.

Figure 17:
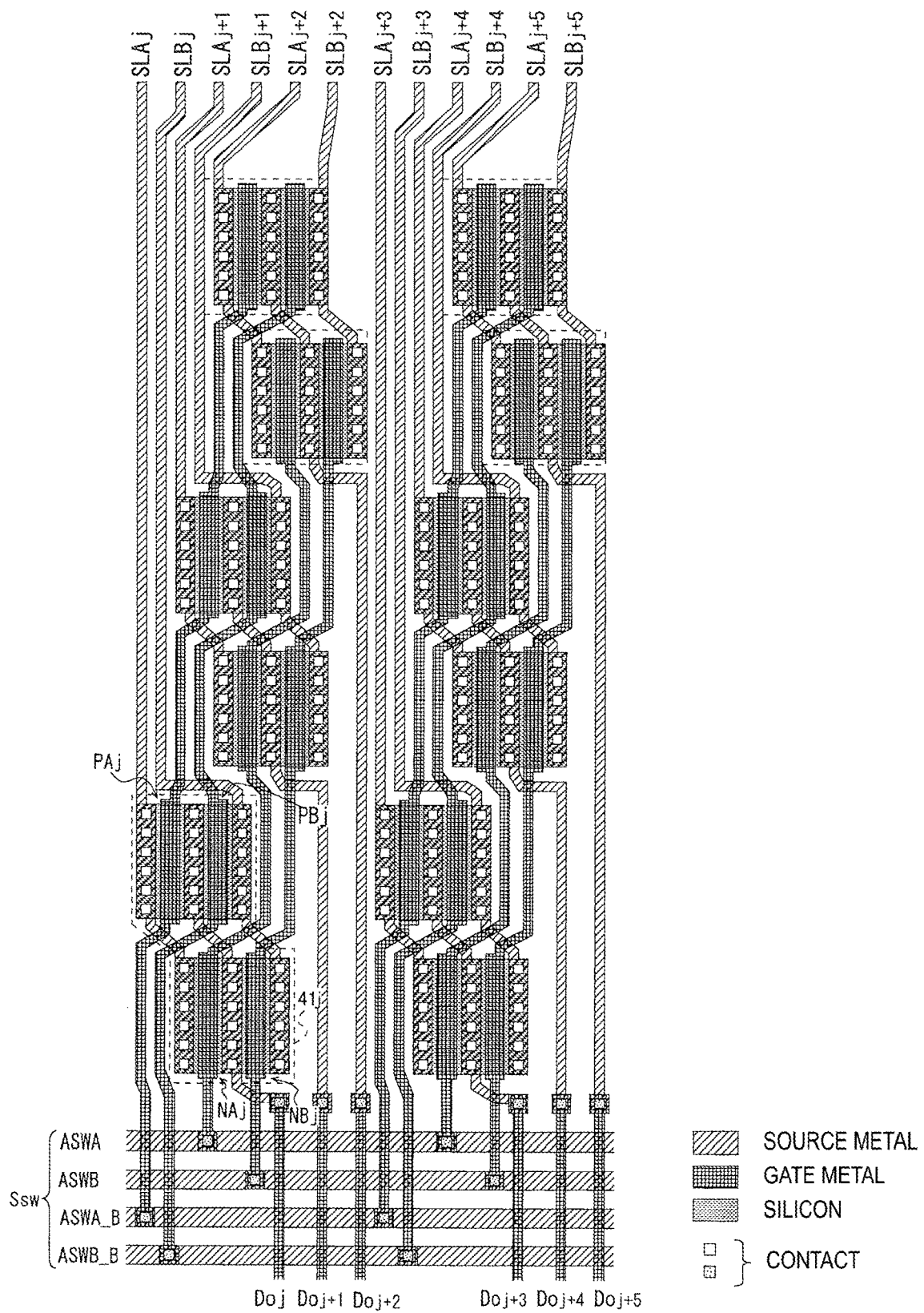
FIG. 17 is a layout diagram for describing a layout pattern of the demultiplexer circuit in a known active matrix display device (third known example) corresponding to the third embodiment.

FIG. 17 is a layout diagram for describing a layout pattern of the demultiplexer circuit 40 in a known active matrix display device employing the SSD method (hereinafter referred to as "third known example") including a configuration similar to those described above. In the third known example as well, m demultiplexers 411 to 41m in the demultiplexer circuit 40 are grouped with adjacent three demultiplexers as one set. In the third known example, as illustrated in FIG. 15, each demultiplexer 41j includes four connection control transistors NAj, PAj, NBj, and PBj constituting the first and the second COS transmission gates, and thus twelve connection control transistors are included in one set constituted by the three demultiplexers. As illustrated in FIG. 17, the twelve connection control transistors are arranged to be aligned in the extending direction of the source line with the four transistors included in the one demultiplexer as a unit while positions of the twelve connection control transistors are sequentially shifted in the vertical direction with respect to the source line. Here, the layout pattern of each demultiplexers 41j is configured such that two N-channel transistors NAj and NBj and two P-channel transistors PAj and PBj are aligned in the extending direction of the source line while positions of the two N-channel transistors NAj and NBj and two P-channel transistors PAj and PBj are shifted in the vertical direction with respect to the source line, and in each demultiplexer 41j, a direction in which the two P-channel transistors PAj and PBj are shifted in the vertical direction of the source line with respect to the two N-channel transistors NAj and NBj and a direction in which the twelve connection control transistors in one set are sequentially shifted in position in the vertical direction with respect to the source line with four connection control transistors included in one demultiplexer as one unit are opposite to each other.

In FIG. 17, when attention is paid to the layout pattern (path layout pattern) of the path in the demultiplexer circuit supplying the data signal DXj to each source line SLXj (j=1 to m, X=R and B), the difference between the path layout patterns is relatively small for adjacent source lines in the same set. However, similar to the above-described second known example (FIG. 13), in a case where a demultiplexer to which one of the adjacent source lines is connected and a demultiplexer to which the other is connected are included in different sets, as in the (j+2)-th B source line SLBj+2 and the (j+3)-th A source line SLAj+3, path layout patterns for the adjacent source lines are significantly different, and the length of one source line (SLBj+2) and the length of the other source line (SLAj+3) are also significantly different. As a result, significant difference occurs between the charging rate when the one source line (SLBj+2) is charged with a voltage of the data signal DBj+2 supplied thereto and the charging rate when the other source line (SLRj+3) is charged with a voltage of the data signal DRj+3 supplied thereto. Thus, in the third known example as well, even if each source line is driven so that the entire screen is displayed in the same gray scale, the striped unevenness as illustrated in FIG. 7 may be visually recognized.

Figure 18:
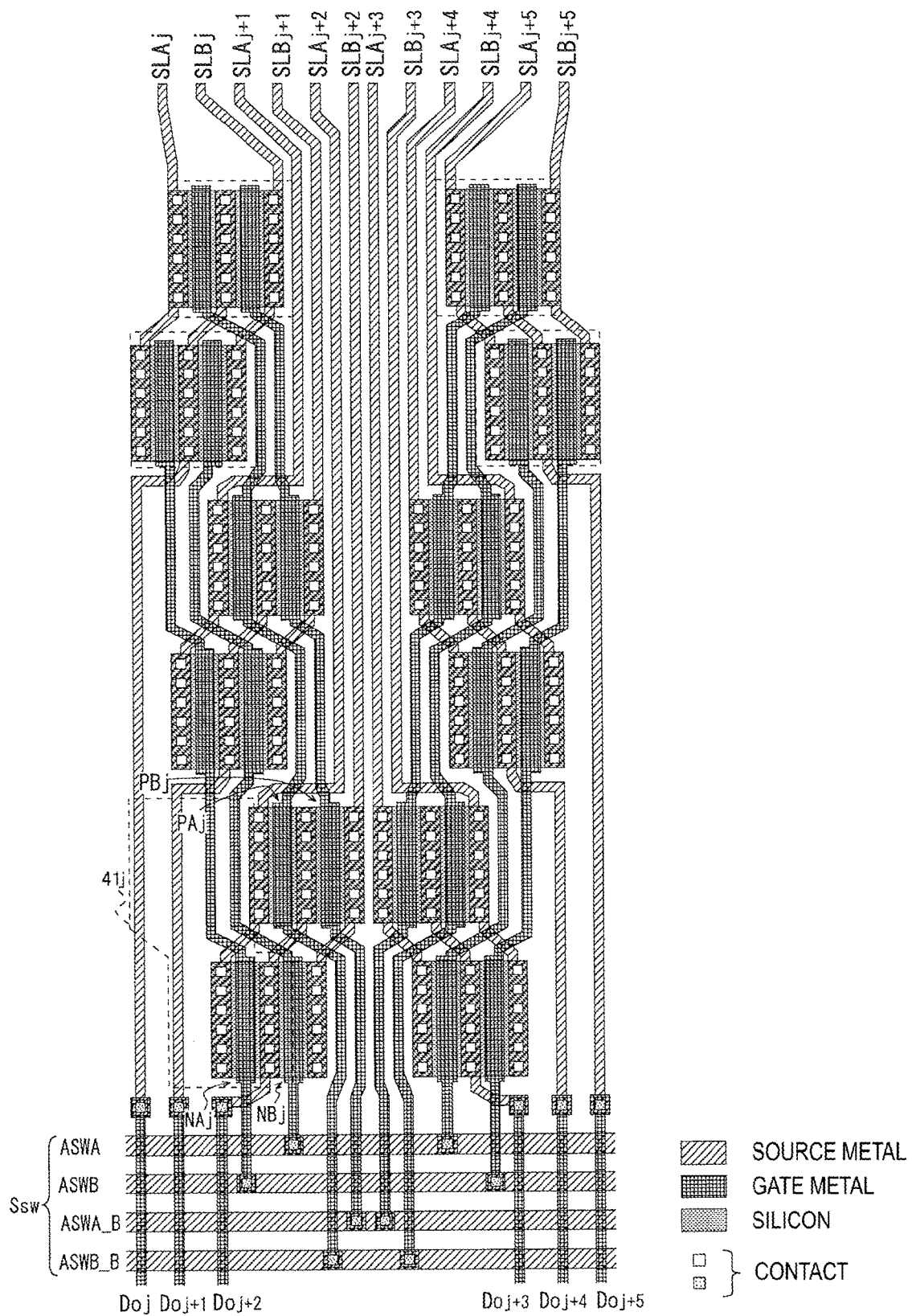
FIG. 18 is a layout diagram for describing a layout pattern of the demultiplexer circuit in the third embodiment.

In contrast, in the present embodiment, a layout pattern as illustrated in FIG. 7 is employed for the demultiplexer circuit 40 in order to suppress the occurrence of the striped unevenness as illustrated in FIG. 18. In other words, similar to the above-described third known example, twelve connection control transistors in one set are arranged to be aligned in the extending direction of the source line with four transistors included in one demultiplexer as a unit while positions of the twelve transistors are sequentially shifted in the vertical direction with respect to the source line (see FIG. 17). However, unlike the third known example, in any two adjacent sets, a direction in which twelve transistors included in the three demultiplexers in one set are shifted in the vertical direction with respect to the source line with the four transistors as a unit and a direction in which twelve transistors included in the three demultiplexers in the other set are shifted in the vertical direction with respect to the source line with the four transistors as a unit are opposite to each other. In other words, the layout pattern of the demultiplexer circuit 40 is, similar to the first and second embodiments (FIG. 6 and FIG. 14), configured to be the diagonal arrangement configuration in which the shift direction is alternately reversed for each set.

According to the present embodiment, although the lengths of the source lines SLXj (j=1 to m, X=A and B) are different, similar to the first and second embodiments, the difference between path layout patterns corresponding to any adjacent source lines are relatively small, and the lengths of the adjacent source lines will not be significantly different from each other. Thus, no significant difference in the charging rate occurs between the adjacent source lines when they are driven. As a result, in a display device in which the layout pattern of the demultiplexer circuit is configured to be the diagonal position configuration in order to correspond to a narrow pixel pitch, occurrence of the striped unevenness as illustrated in FIG. 7 is suppressed, and in a case where each source line is driven so that the entire screen is displayed in the same gray scale, a display as illustrated in FIG. 8 (luminance distribution) is obtained, and the striped unevenness is not visually recognized.

Figure 19A:
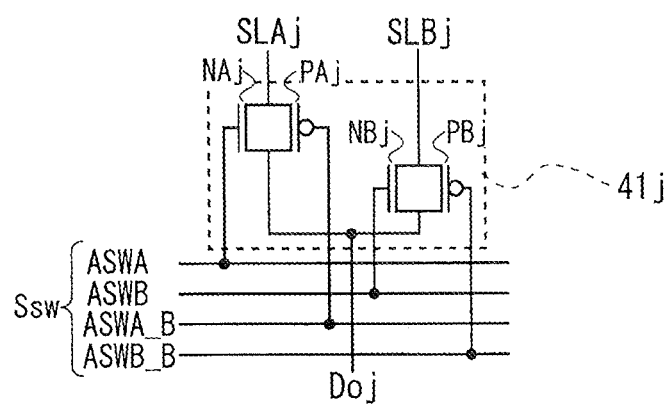
FIG. 19A is a circuit diagram illustrating one demultiplexer in the third embodiment.
Figure 19B:
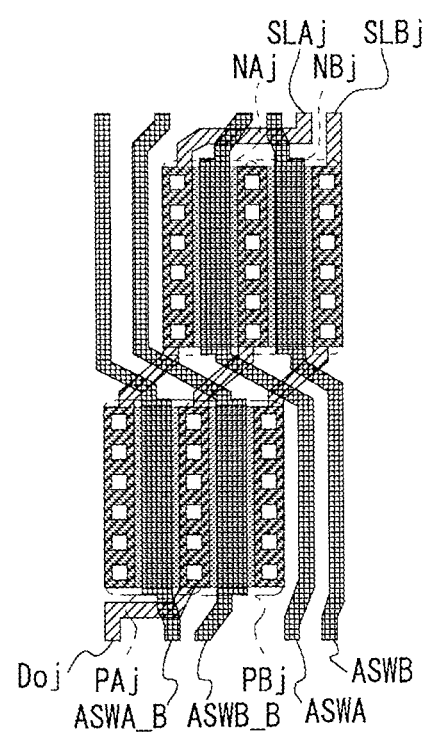
FIG. 19B is a layout diagram illustrating an example of the layout pattern of the above-described one demultiplexer.
Figure 19C:
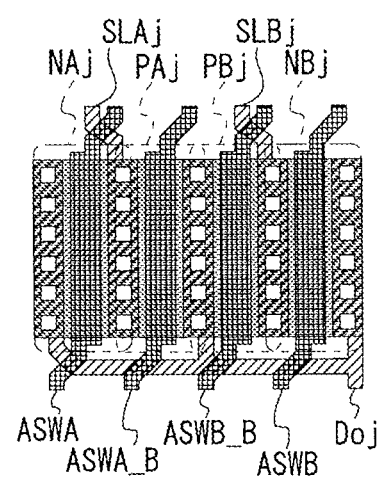
FIG. 19C is a layout diagram illustrating another example of the layout pattern of the above-described one demultiplexer.

In the above-described third embodiment, each demultiplexer 41j includes two CMOS transmission gates, as illustrated in FIG. 19A, and the two CMOS transmission gates are realized using two N-channel transistors NAj and NBj and two P-channel transistors PAj and PBj. As illustrated in FIG. 18 or FIG. 19B, the layout pattern of each demultiplexer 41j can be configured such that two P-channel transistors PAj and PBj and two N-channel transistors NAj and NBj are aligned in the extending direction of the source line while positions of the two P-channel transistors PAj and PBj and two N-channel transistors NAj and NBj are shifted in the vertical direction with respect to the source line, but the present disclosure is not limited to such an arrangement configuration. For example, the two N-channel transistors NAj and NBj and the two P-channel transistors PAj and PBj in each demultiplexer 41j may be arranged in the vertical direction with respect to the source line as illustrated in FIG. 19C. The same applies to the fourth embodiment described below (see FIG. 23) using a CMOS transmission gate as the switching element in the demultiplexer circuit 40.

4. Fourth Embodiment

Next, a liquid crystal display device employing the SSD method (hereinafter referred to as "display device of a fourth embodiment") including an active matrix substrate 100 according to the fourth embodiment will be described. The overall configuration of the display device according to the fourth embodiment is substantially the same as the display device of the third embodiment (see FIG. 15) except for the configuration of the demultiplexer circuit 40, and the same reference signs are assigned to the same or corresponding components and illustrations and detailed descriptions of those components will be omitted.

Figure 20:
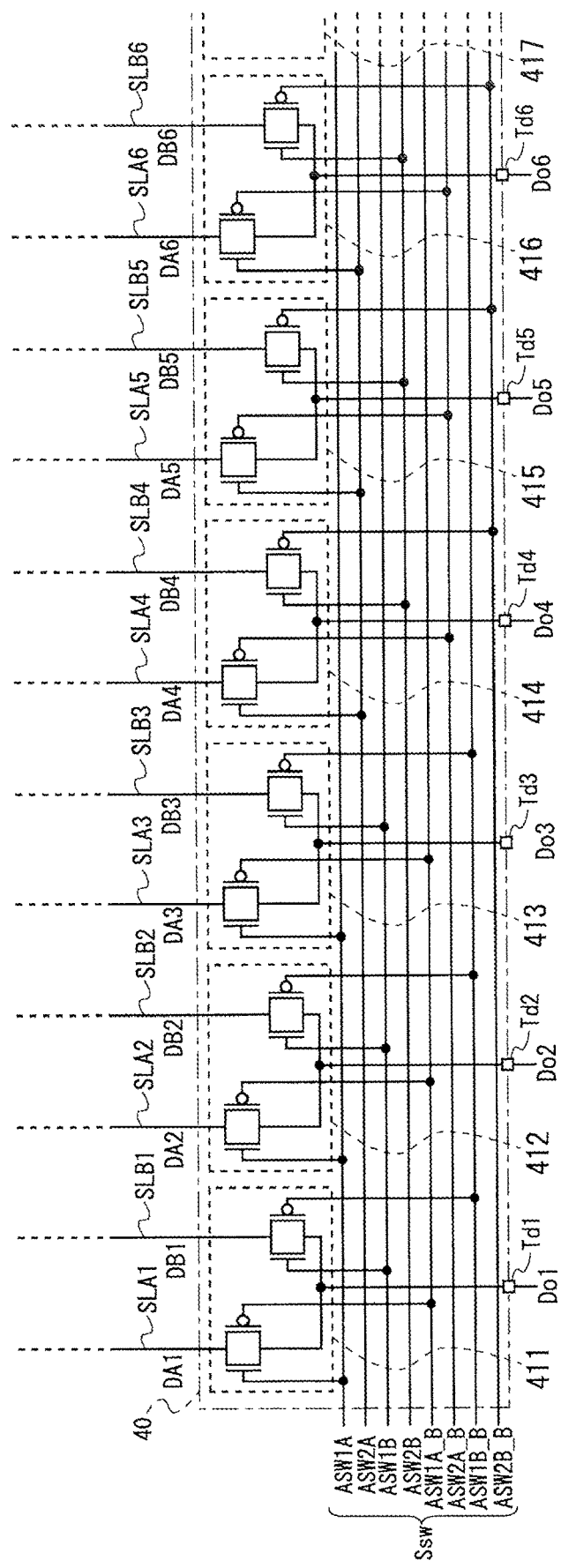
FIG. 20 is a circuit diagram illustrating a configuration of a demultiplexer circuit in a fourth embodiment.

FIG. 20 is a circuit diagram illustrating a configuration of the demultiplexer circuit 40 in the active matrix substrate 100 according to the present embodiment. As illustrated in FIG. 20, in the present embodiment as well, similar to the third embodiment (FIG. 15), each demultiplexer 41j in the demultiplexer circuit 40 is realized by a first CMOS transmission gate constituted by an N-channel transistor NAj and a P-channel transistor PAj connected in parallel with each other and a second CMOS transmission gate constituted by an N-channel transistor NBj and a P-channel transistor PBj connected in parallel with each other (j=1 to m).

In the present embodiment, the configuration of the signal lines for transmitting the four types of control signals corresponding to the control signals ASWA, ASWB, ASWA_B and ASWB_B in the above-described third embodiment as the demultiplexing control signal Ssw to each demultiplexer 41j (j=1 to m) in the demultiplexer circuit 40 is different from the configuration in the third embodiment. In other words, in the above-described third embodiment, as illustrated in FIG. 15, four control signal lines for transmitting the A control signal ASWA, the B control signal ASWB, the A inversion control signal ASWA_B, and the B inversion control signal ASWB_B as the demultiplexing control signal Ssw to each demultiplexer 41j are provided in the demultiplexer circuit 40. In contrast, in the present embodiment, as illustrated in FIG. 20, eight control signal lines for transmitting the first A control signal ASW1A, the second A control signal ASW2A, the first B control signal ASW1B, the second B control signal ASW2B, the first A inversion control signal ASW1A_B, the second A inversion control signal ASW2A_B, the first B inversion control signal ASW1B_B, and the second B inversion control signal ASW2B_B as the demultiplexing control signal Ssw are provided in the demultiplexer circuit 40.

Figure 21:
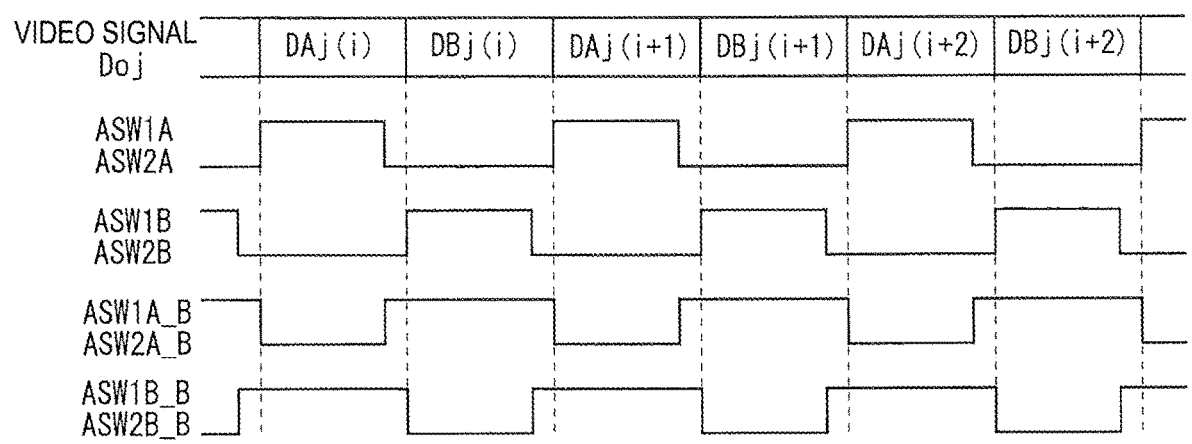
FIG. 21 is a timing chart for describing operations of the demultiplexer circuit in the fourth embodiment.

FIG. 21 is a timing chart for describing operations of the demultiplexer circuit 40 in the present embodiment. As illustrated in FIG. 21, multiplexed data signals Do1 to Dom as video signals supplied to input terminals Td1 to Tdm corresponding to demultiplexers 411 to 41m, respectively, of the demultiplexer circuit 40 from the source driver 30 in the present embodiment are the same as the multiplexed data signals Do1 to Dom in the second and the third embodiments (see FIG. 12 and FIG. 16).

As illustrated in FIG. 21, in the demultiplexing control signal Ssw supplied to the demultiplexer circuit 40 in the present embodiment, the first and second A control signals ASW1A and ASW2A are the same signals as the A control signal ASWA in the third embodiment, the first and second B control signals ASW1B and ASW2B are the same signals as the B control signal ASWB in the third embodiment, the first and second A inversion control signals ASW1A_B and ASW2A_B are the same signals as the A inversion control signal ASWA_B in the third embodiment, and the first and second B inversion control signals ASW1B_B and ASW2B_B are the same signals as the B inversion control signal ASWB_B in the third embodiment (see FIG. 16). The first and second A control signals ASW1A and ASW2A, the first and second B control signals ASW1B and ASW2B, the first and second A inversion control signals ASW1A_B and ASW2A_B, and the first and second B inversion control signals ASW1B_B and ASW2B_B are generated by the display control circuit 20 and are supplied to the demultiplexer circuit 40 as the demultiplexing control signal Ssw.

As described above, in the demultiplexer circuit 40, eight control signal lines (hereinafter the eight control signal lines are referred to as "first A control signal line CL1A", "second A control signal line CL2A", "first B control signal line CL1B", "second B control signal line CL2B", "first A inversion control signal line CL1A_B", "second A inversion control signal line CL2A_B", "first B inversion control signal line CL1B_B", and "second B inversion control signal line CL2B_B") for transmitting the first A control signal ASW1A, the second A control signal ASW2A, the first B control signal ASW1B, the second B control signal ASW2B, the first A inversion control signal ASW1A_B, the second A inversion control signal ASW2A_B, the first B inversion control signal ASW1B_B, and the second B inversion control signal ASW2B_B, respectively, are arranged. Hereinafter, the first A control signal line CL1A, the first B control signal line CL1B, the first A inversion control signal line CL1A_B, and the first B inversion control signal line CL1B_B are referred to as "control signal lines of the first stage", and the second A control signal line CL2A, the second B control signal line CL2B, the second A inversion control signal line CL2A_B, and the second B inversion control signal line CL2B_B are referred to as "control signal lines of the second stage".

In the demultiplexer circuit 40 according to the present embodiment, among the m demultiplexers 411 to 41m, m/2 demultiplexers are connected to the control signal lines of the first stage, and the other m/2 demultiplexers are connected to the control signal lines of the second stage (m is an even number). In the configuration example illustrated in FIG. 20, the connection to the control signal lines of the first stage and the connection to the control signal lines of the second stage are switched alternately for every three demultiplexers. Thus, for example, in each of the first to third demultiplexers 411 to 413, the first A control signal line CL1A and the first A inversion control signal line CL1A_B are connected to the gate terminals of the N-channel transistor NAj and the P-channel transistor PAj, respectively, in the first CMOS transmission gate, the first B control signal line CL1B and the first B inversion control signal line CL1B_B are connected to the gate terminals of the N-channel transistor NBj and the P-channel transistor PBj, respectively, in the second CMOS transmission gate (j=1 to 3), and for example, in each of the fourth to sixth demultiplexers 414 to 416, the second A control signal line CL2A and the second A inversion control signal line CL2A_B are connected to the gate terminals of the N-channel transistor NAj and the P-channel transistor PAj, respectively, in the first CMOS transmission gate, the second B control signal line CL2B and the second B inversion control signal line CL2B_B are connected to the gate terminals of the N-channel transistors NBj and P-channel transistor PBj, respectively, in the second CMOS transmission gate (j=4 to 6).

With such a configuration (hereinafter referred to as "SSD double-driving configuration"), in the present embodiment, each two control signal lines is provided for transmitting each of four types of control signals (ASW1A and ASW2A), (ASW1B and ASW2B), (ASW1A_B and ASW2A_B), and (ASW1B_B and ASW2B_B) corresponding to control signals ASWA, ASWB, ASWA_B, and ASWB_B as the demultiplexing control signal Ssw in the third embodiment.

Figure 22:
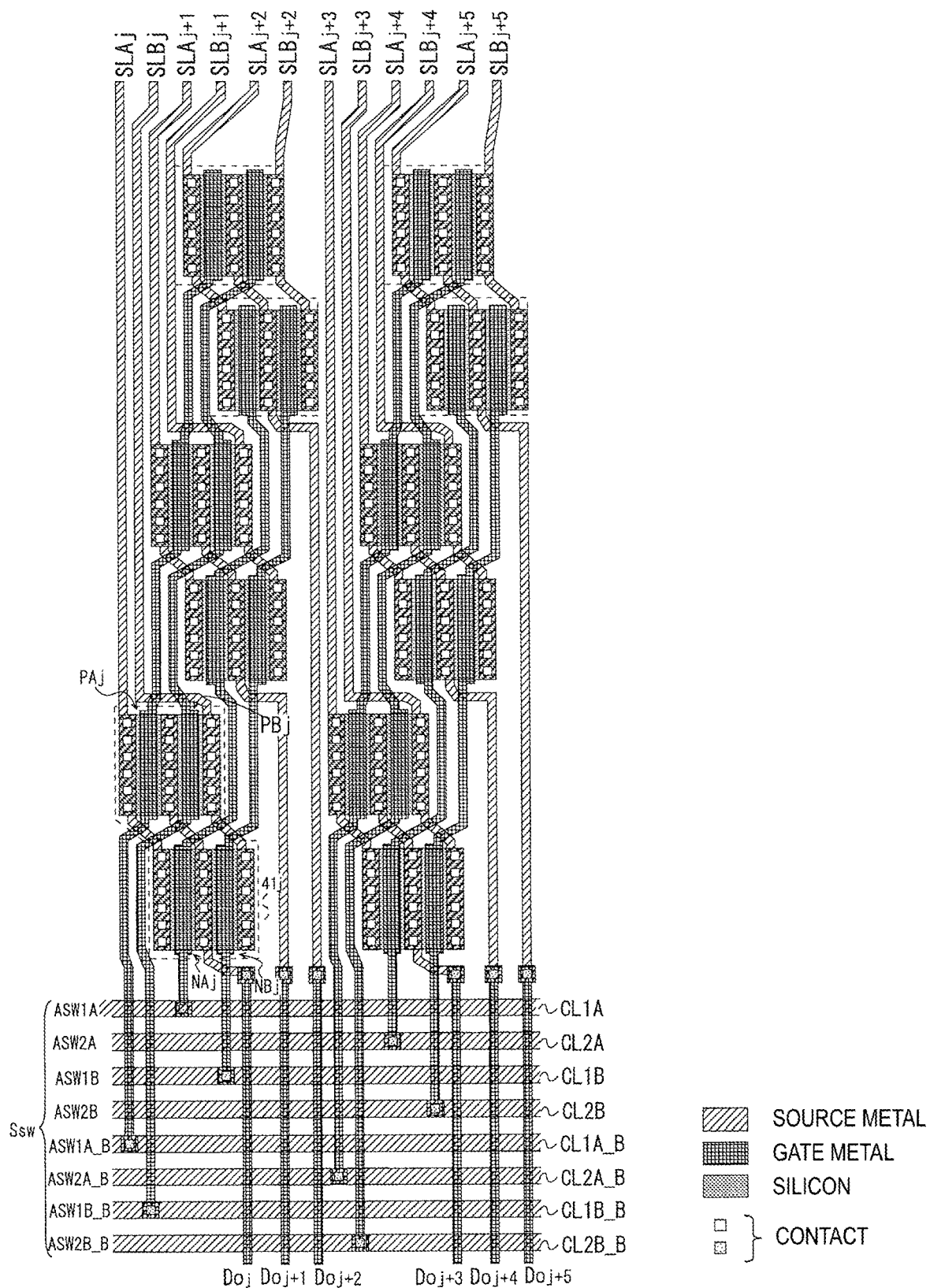
FIG. 22 is a layout diagram for describing a layout pattern of the demultiplexer circuit in a known active matrix display device (fourth known example) corresponding to the fourth embodiment.

FIG. 22 is a layout diagram for describing a layout pattern of the demultiplexer circuit 40 in a known active matrix display device employing the SSD method (hereinafter referred to as "fourth known example") including a configuration similar to those described above. As illustrated in FIG. 22, eight control signal lines including the first A control signal line CL1A, the second A control signal line CL2A, the first B control signal line CL1B, the second B control signal line CL2B, the first A inversion control signal line CL1A_B, the second A inversion control signal line CL2A_B, the first B inversion control signal line CL1B_B, and the second B inversion control signal line CL2B_B for transmitting control signals ASW1A, ASW2A, ASW1B, ASW2B, ASW1A_B, ASW2A_B, ASW1B_B, and ASW2B_B, respectively, as the demultiplexing control signal Ssw are arranged.

In the fourth known example, m demultiplexers 411 to 41m in the demultiplexer circuit 40 are grouped with adjacent three demultiplexers as one set, and as can be seen by comparing FIG. 22 with FIG. 17, the layout pattern of the demultiplexer circuit 40 in the fourth known example is the same as the layout pattern of the demultiplexer circuit 40 in the above-described third known example except for the layout patterns associated with the above-described control signal lines CL1A, CL2A, CL1B, CL2B, CL1A_B, CL2A_B, CL1B_B, and CL2B_B. Thus, as illustrated in FIG. 22, similar to the above-described third known example (FIG. 17), in a case where a demultiplexer to which one of the adjacent source lines is connected and a demultiplexer to which the other is connected are included in different sets, as in the (j+2)-th B source line SLBj+2 and the (j+3)-th A source line SLAj+3, path layout patterns for the adjacent source lines are significantly different, and the length of the one source line (SLBj+2) and the length of the other source line (SLAj+3) are also significantly different. As a result, significant difference occurs between the charging rate when the one source line (SLBj+2) is charged with a voltage of the data signal DBj+2 supplied thereto and the charging rate when the other source line (SLRj+3) is charged with a voltage of the data signal DRj+3 supplied thereto. Thus, in the fourth known example as well, similar to the above-described third known example, even if each source line is driven so that the entire screen is displayed in the same gray scale, the striped unevenness as illustrated in FIG. 7 may be visually recognized.

Figure 23:
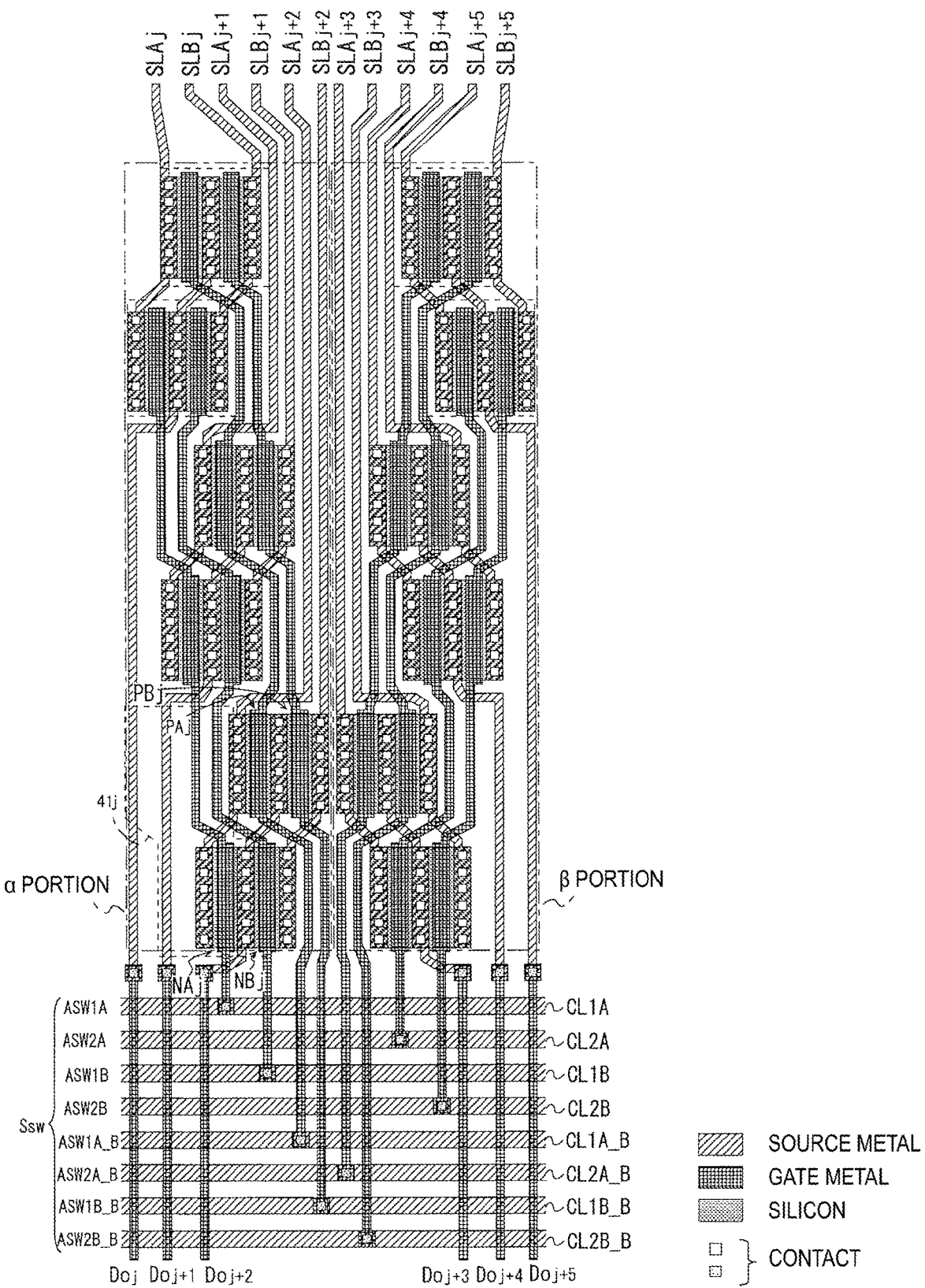
FIG. 23 is a layout diagram for describing a layout pattern of the demultiplexer circuit in the fourth embodiment.

In contrast, in the present embodiment, in order to suppress the occurrence of the striped unevenness as illustrated in FIG. 7, the layout pattern of the demultiplexer circuit 40 is, similar to the third embodiment (FIG. 18), configured to be the diagonal arrangement configuration in which the shift direction is alternately reversed for each set. In other words, in the present embodiment, a layout pattern as illustrated in FIG. 23 is employed for the demultiplexer circuit 40, and in any two adjacent sets, a direction in which twelve transistors included in the three demultiplexers in one set are shifted in the vertical direction with respect to the source line with the four transistors (two CMOS transmission gates) in one demultiplexer as a unit, and a direction in which twelve transistors included in the three demultiplexers in the other set are shifted in the vertical direction with respect to the source line with the four transistors (two CMOS transmission gates) in one demultiplexer as a unit are opposite to each other.

According to the present embodiment, although the lengths of the source lines SLXj (j=1 to m, X=A and B) are different, similar to the first to third embodiments (FIG. 6, FIG. 14, and FIG. 18), the difference between path layout patterns corresponding to any adjacent source lines are relatively small, and the lengths of the adjacent source lines will not be significantly different from each other. Thus, no significant difference in the charging rate occurs between the adjacent source lines when they are driven. As a result, in a display device in which the layout pattern of the demultiplexer circuit is configured to be the diagonal position configuration in order to correspond to a narrow pixel pitch, occurrence of the striped unevenness as illustrated in FIG. 7 is suppressed, and in a case where each source line is driven so that the entire screen is displayed in the same gray scale, a display as illustrated in FIG. 8 (luminance distribution) is obtained, and the striped unevenness is not visually recognized.

Figure 24:
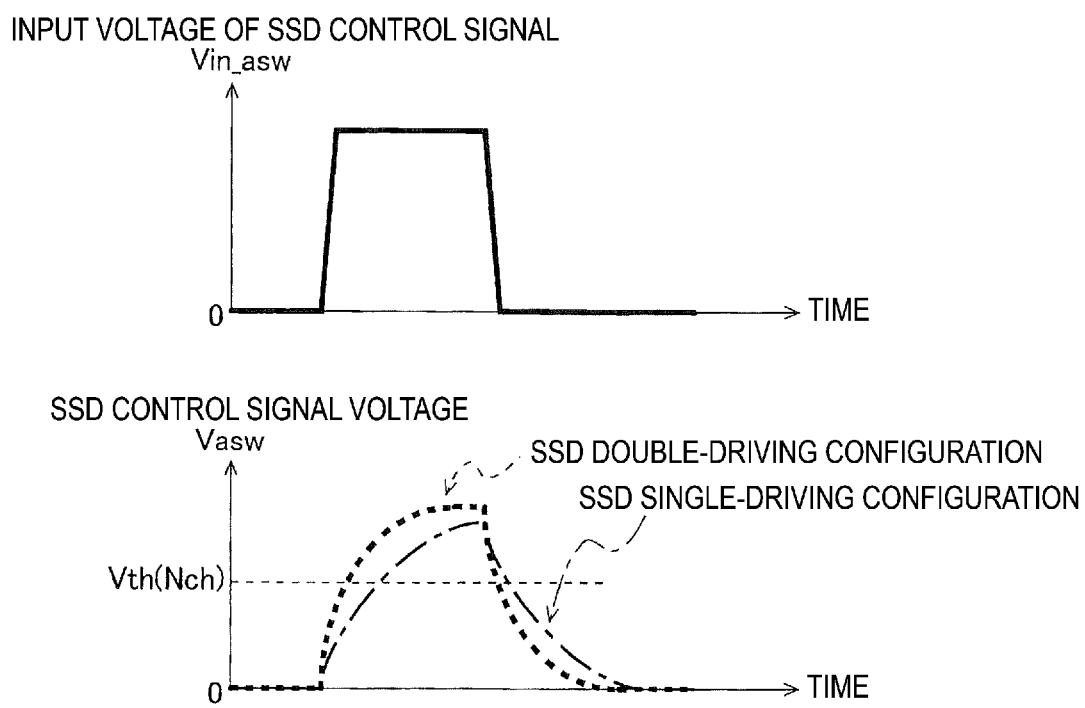
FIG. 24 is a signal waveform diagram for describing effects in the fourth embodiment.

Additionally, in the present embodiment, as described above, since the configuration (SSD double-driving configuration) in which each two control signal lines is provided for transmitting each of four types of control signals corresponding to control signals ASWA, ASWB, ASWA_B, and ASWB_B as the demultiplexing control signal Ssw in the third embodiment is employed (see FIG. 20), as illustrated in FIG. 24, the load per one control signal line is ½ compared to the third embodiment, and the waveform dullness of the control signals ASW1A, ASW2A, ASW1B, ASW2B, ASW1A_B, ASW2A_B, ASW1B_B, and ASW2B_B becomes smaller. Note that FIG. 24 illustrates a waveform of a voltage Vin_asw of a control signal ASWkX (k=1 or 2, X=A or B) of any of the control signals ASW1A, ASW2A, ASW1B, and ASW2B at the input end of the demultiplexer circuit 40, and a waveform of a voltage Vasw of the control signal ASWkX when the control signal ASWkX is supplied to the gate terminal of either the transistor NAj or the NBj in the demultiplexer circuit 40. As can be seen in FIG. 24, according to the present embodiment in which such an SSD double-driving configuration is employed, compared to the configuration (hereinafter referred to as "SSD single-driving configuration") in which each one control signal line is provided for transmitting each of above-described control signals ASWA, ASWB, ASWA_B, and ASWB_B in the third embodiment (see FIG. 15), the waveform dullness of the voltage Vasw of the control signal supplied to the gate terminals of each transistor in the demultiplexer circuit 40 is reduced, and the on-period of the transistor becomes longer. As a result, the time for charging each source line with the multiplexed data signal Doj as the video signal can be sufficiently ensured, and the charging rate is improved. Thus, in the present embodiment, such an SSD double-driving configuration also contributes to suppression of the striped unevenness as illustrated in FIG. 7.

Note that, although in the present embodiment, although the configuration in which each two control signal lines is provided for transmitting each of a plurality of types of control signals (in the above-described third embodiment, four types of control signals ASWA, ASWB, ASWA_B, and ASWB_B) for constituting the demultiplexing control signal Ssw, in other words, the SSD double-driving configuration is employed (FIG. 20), instead of this, a configuration in which a predetermined number of three or more control signal lines are provided for transmitting each of the plurality of types of control signals may be employed. In other words, by employing a configuration in which control signal lines having a number of two or more times the number of control signals required for each demultiplexer 41j (connection control transistors included therein) are arranged in the demultiplexer circuit 40, the load per one control signal line for transmitting the plurality of types of control signals constituting the demultiplexing control signal Ssw is reduced, and the same effect as in the present embodiment can be obtained.

In the present embodiment as well, similar to the first to third embodiments, m demultiplexers 411 to 41m in the demultiplexer circuit 40 are grouped with adjacent plurality of demultiplexers as one set, the transistors included in each set are arranged to be aligned in the extending direction of the source line with a predetermined number of transistors as a unit while positions of the transistors included in each set are sequentially shifted in the vertical direction with respect to the source line, and in any two adjacent sets, a direction in which positions of the transistors included in one set are shifted in the vertical direction with respect to the source line with the predetermined number of transistors as the unit and a direction in which positions of the transistors included in another set are shifted in the vertical direction with respect to the source line with the predetermined number of transistors as the unit are opposite to each other. In other words, the diagonal arrangement configuration of alternately reversing shift direction is employed for the layout pattern of the demultiplexer circuit 40. Here, a set in which transistors are arranged to be shifted in the vertical direction with respect to the source line in the same direction as the direction in which the transistors included in the one set are shifted in the vertical direction with respect to the source line with the predetermined number of transistors included in the one set as the unit is referred to as "α portion", and a set in which transistors are arranged to be shifted in the vertical direction with respect to the source line in the same direction as the direction in which the transistors included in the other set are shifted in the vertical direction with respect to the source line with the predetermined number of transistors included in the other set as the unit is referred to as "β portion".

In the demultiplexer circuit 40 according to the present embodiment, in a case where only one of the control signal lines of the first stage CL1A, CL1B, CL1A_B, and CL1B_B, or the control signal lines of the second stage CL2A, CL2B, CL2A_B, and CL2B_B is connected to all of the α portions, and only the other one of the control signal lines of the first stage CL1A, CL1B, CL1A_B, and CL1B_B, or the control signal lines of the second stage CL2A, CL2B, CL2A_B, and CL2B_B is connected to all of the β portions, in a case where patterns are formed to be shifted in the vertical direction with respect to the source line between different layers during manufacturing of the active matrix substrate 100, a difference in load may occur between the control signal lines connected to the α portions and the control signal lines connected to the β portions. When such a difference in load occurs, a difference in the charging rate may occur between the source lines connected to the α portions and the source lines connected to the β portions, and as a result, the striped unevenness as illustrated in FIG. 7 may be visually recognized in the display portion 101.

Figure 25:
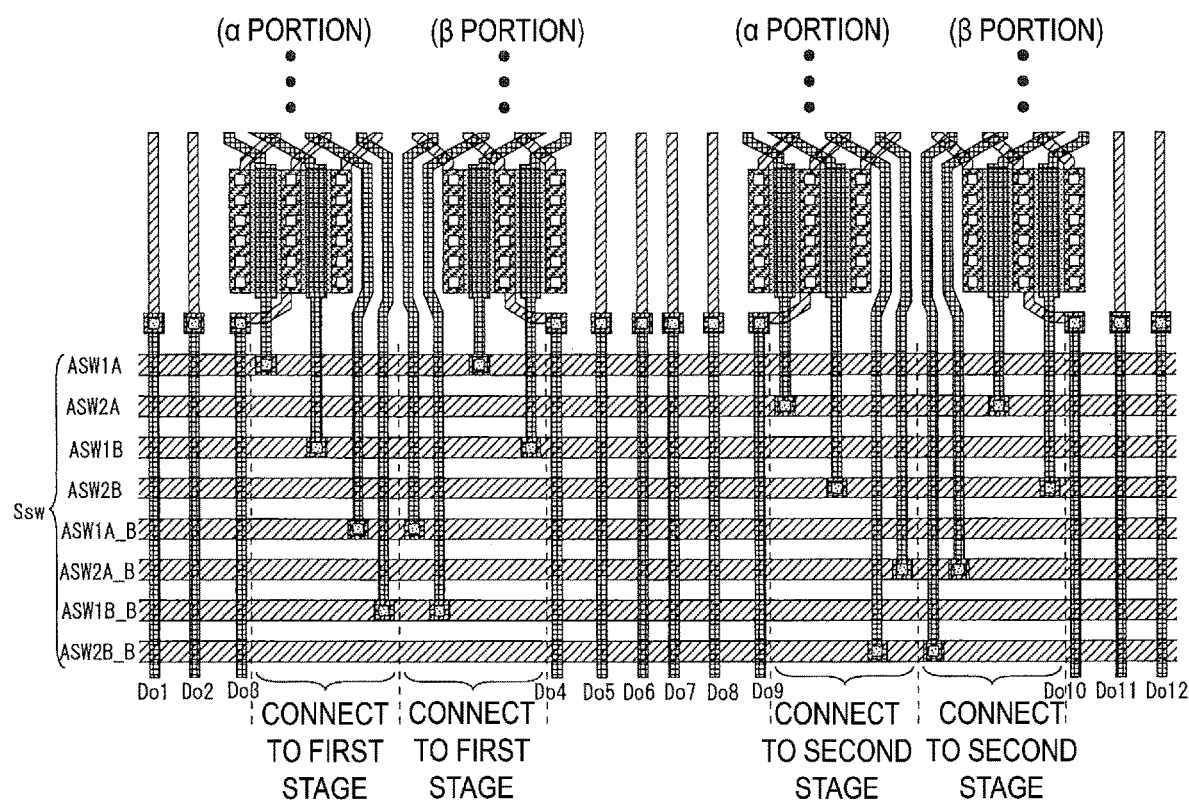
FIG. 25 is a layout diagram illustrating an example of a connection form of a control signal line of a demultiplexer circuit in the fourth embodiment.
Figure 26:
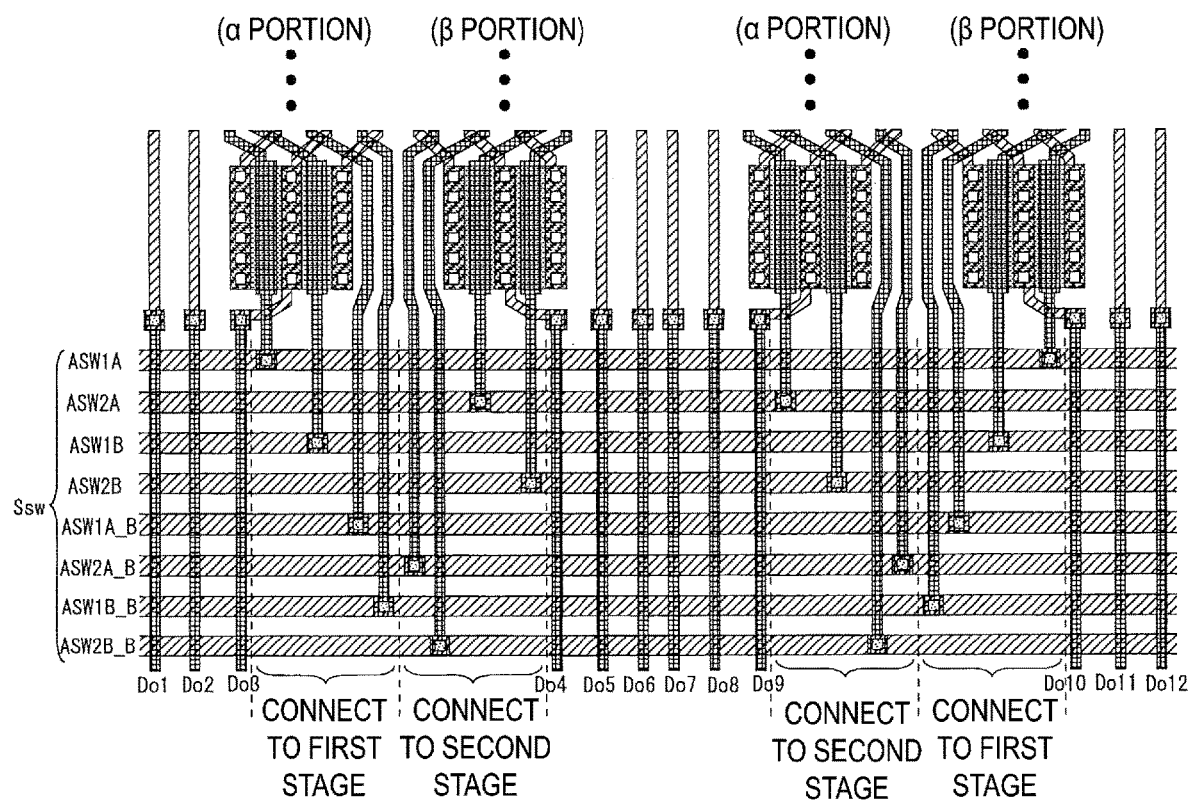
FIG. 26 is a layout diagram illustrating another example of the connection form of the control signal line of the demultiplexer circuit in the fourth embodiment.

Accordingly, in order to suppress the occurrence of such striped unevenness, it is preferable that the control signal lines of the first stage and the control signal lines of the second stage are evenly connected to the α portions included in the demultiplexer circuit 40, and the control signal lines of the first stage and the control signal lines of the second stage are evenly connected to the β portions included in the demultiplexer circuit 40. For example, it is preferable that control signal lines of the first stage, control signal lines of the first stage, control signal lines of the second stage, and control signal lines of the second stage, . . . , are connected to sets of the demultiplexers aligned in the order of an α portion, a β portion, an α portion, and a β portion, . . . , respectively, in the vertical direction with respect to the source line as illustrated in FIG. 25, or control signal lines of the first stage, control signal lines of the second stage, control signal lines of the second stage, and control signal lines of the first stage, . . . are connected as illustrated in FIG. 26. In this way, the control signal lines of the first stage are connected to half of each of the α portions and the β portions included in the demultiplexer circuit 40, and the control signal lines of the second stage are connected to the remaining half.

5. Fifth Embodiment

Next, a liquid crystal display device employing the SSD method (hereinafter referred to as "display device of a fifth embodiment") including an active matrix substrate 100 according to the fifth embodiment will be described. The overall configuration of the display device according to the fifth embodiment is the same as the display device of the first embodiment (see FIG. 1 to FIG. 3), and the same reference signs are assigned to the same or corresponding components and illustrations. The demultiplexer circuit 40 according to the present embodiment is similar to that of the above-described first embodiment for the circuit configuration (see FIG. 2), but the layout pattern is different from that of the first embodiment. In other respects in the present embodiment, the configuration is similar to that of the above-described first embodiment, and thus the description thereof will be omitted.

As described above, in the layout pattern of the demultiplexer circuit according to the first embodiment, m demultiplexers 411 to 41m in the demultiplexer circuit 40 are grouped with adjacent three demultiplexers as one set, the nine transistors included in each set are arranged to be aligned in the extending direction of the source line with three transistors as a unit while positions of the nine transistors included in each set are sequentially shifted in the vertical direction with respect to the source line, and in any two adjacent sets, a direction in which the transistors included in one set is shifted in the vertical direction with respect to the source line with the three transistors included in one set as a unit and a direction in which the transistors included in another set is shifted in the vertical direction with respect to the source line with the three transistors included in another set as a unit are opposite to each other (FIG. 6). Here, similar to the fourth embodiment, a set in which transistors are arranged to be shifted in the vertical direction with respect to the source line in the same direction as the direction in which the transistors included in the one set are shifted in the vertical direction with respect to the source line with the three transistors included in the one set as the unit is referred to as "α portion", and a set in which transistors are arranged to be shifted in the vertical direction with respect to the source line in the same direction as the direction in which the transistors included in the other set are shifted in the vertical direction with respect to the source line with the three transistors included in the other set as the unit is referred to as "β portion".

In the layout illustrated in FIG. 6 in the first embodiment, three transistors MRk, MGk, and MBk (k=1 to m) as a unit are arranged in the vertical direction (the left and right direction in the drawing) with respect to the source line, the positional relationship between the gate and the drain (whether the drain is on the right side or the left side of the gate) in the vertical direction (the left and right direction in the drawing) with respect to the source line in each of the three transistors is opposite to each other in the α portion and β portion for the G connection control transistor MGk. Here, among the conduction terminals of each transistor, a terminal connected to a source line is referred to as "drain", and a terminal connected to a video signal line (signal line connecting the output terminals To1 to Tom of the source driver 30 and the input terminals Td1 to Tdm of the demultiplexer circuit 40, respectively) is referred to as "source" (The same applies to the following). As illustrated in FIG. 6, in the G connection control transistor (the transistor connected to the G control signal ASWG) in the α portion, the drain is arranged on the right side of the gate, but in the G connection control transistor in the β portion, the drain is arranged on the left side of the gate. Note that the positional relationship between the gate and the drain in the R connection control transistor (the transistor connected to the R control signal ASWR) and the B connection control transistor (the transistor connected to the B control signal ASWB) is the same.

Figure 27:
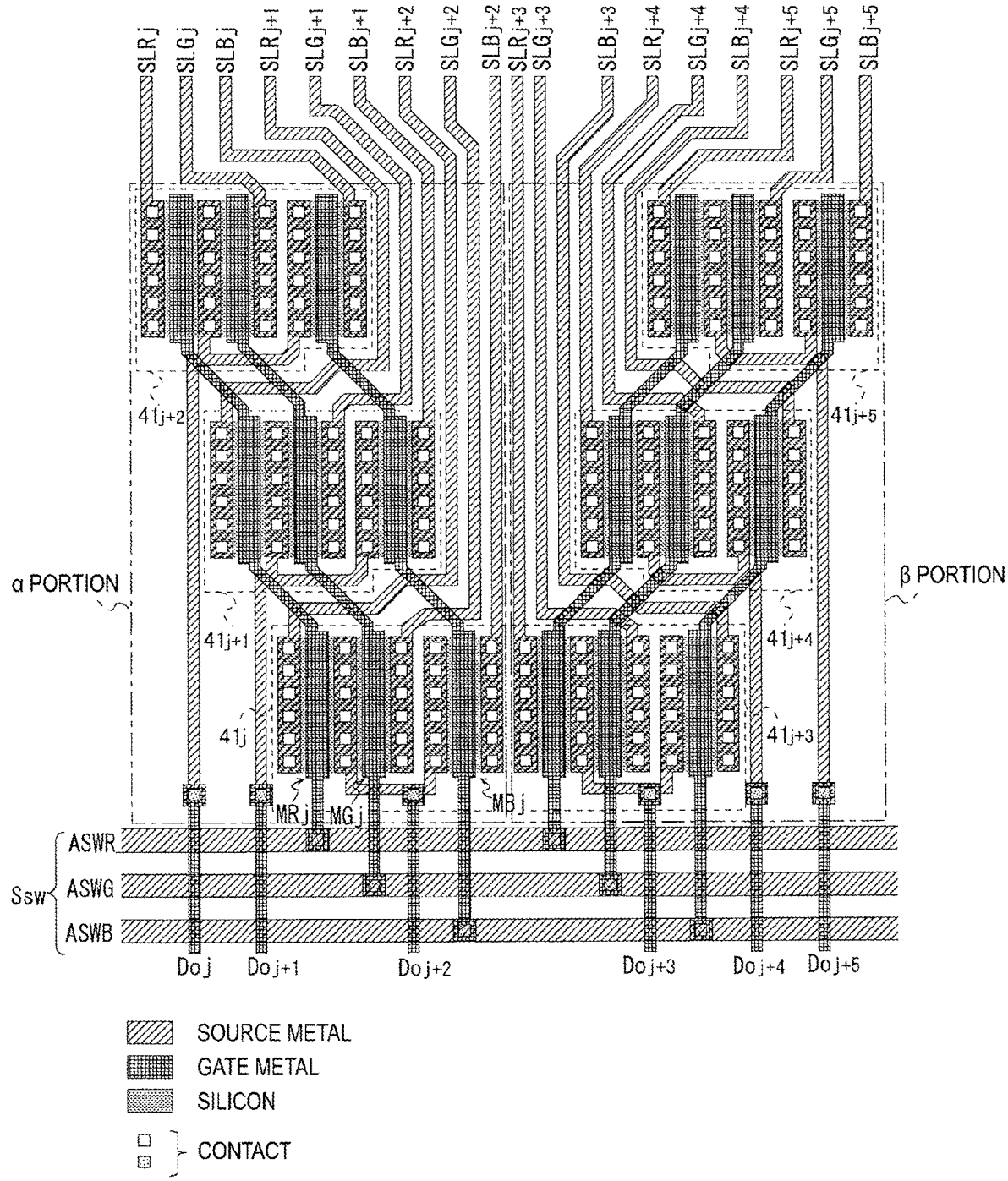
FIG. 27 is a layout diagram for describing a layout pattern of the demultiplexer circuit in the fifth embodiment.

FIG. 27 is a layout diagram for describing a layout pattern of the demultiplexer circuit 40 in the present embodiment. As illustrated in FIG. 27, the layout pattern of the demultiplexer circuit 40 according to the present embodiment is basically the same as that of the first embodiment (FIG. 6), and m demultiplexers 411 to 41m in the demultiplexer circuit 40 are grouped with adjacent three demultiplexers as one set, and nine transistors included in each set are arranged to be aligned in the extending direction of the source line with the three transistors as a unit while positions of the nine transistors included in each set are sequentially shifted in the vertical direction with respect to the source line. However, in the present embodiment, the positional relationship between the gate and the drain in the vertical direction (the left and right direction in the drawing) with respect to the source line in each of the three transistors MRk, MGk, and MBk as the unit is the same between the α portion and the β portion for each of the three transistors MRk, MGk, and MBk. In other words, as illustrated in FIG. 27, the source is shared by the R connection control transistor MRk and the G connection control transistor MGk in both the α portion and the β portion, among the three transistors MRk, MGk, and MBk, for the R connection control transistor MRk, the drain is arranged on the left side (in the drawing) of the gate, and for the G connection control transistor MGk and the B connection control transistor MBk, the drain is arranged on the right side (in the drawing) of the gate in both the α portion and the β portion.

Figure 28:
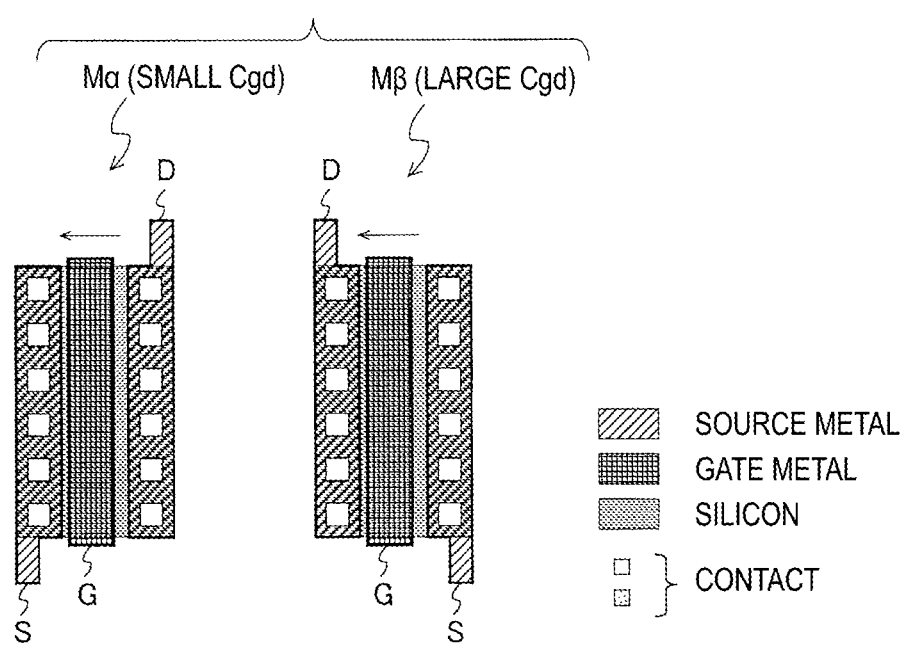
FIG. 28 is a diagram for describing a relationship between a layout pattern of a transistor as a switching element in a demultiplexer circuit and a feed-through voltage.

FIG. 28 is a diagram for describing a relationship between a layout pattern of a transistor as a switching element in a demultiplexer circuit and a feed-through voltage. Now, consider the case that, in a case of manufacturing the active matrix substrate 100, the gate metal is formed to be shifted to the left side (in the drawing) with respect to the source metal. In this case, in a transistor Mα in which the drain D is arranged on the right side (in the drawing) of the gate G, the parasitic capacitance Cgd between the gate and the drain is smaller than the original value (value in a case where there is no pattern shift during manufacturing), and in a transistor Mβ in which the drain D is arranged on the left side (in the drawing) of the gate G, the parasitic capacitance Cgd between the gate and drain is greater than the original value. As a result, the feed-through voltage (absolute value), in other words, the voltage ΔV given by the following Equation, generated when the transistor in the demultiplexer circuit 40 changes from the on state to the off state, is smaller than the original value for the transistor Mα illustrated in FIG. 28, and is greater than the original value for the transistor Mβ illustrated in FIG. 28.

$$\Delta V = \{Cgd/(Cgd+Csl)\}|VGon-VGoff| \quad (1)$$

Where, Csl is the wiring line capacitance of a source line connected to a transistor changing from an on state to an off state and Csl=Csld+C2, Csld is the wiring line capacitance of a portion of the display portion 101 in the source line, C2 is the wiring line capacitance of a portion of the demultiplexer circuit 40 in the source line, VGon is a voltage supplied to the gate terminal of the transistor when the transistor is turned on, and VGoff is the voltage supplied to the gate terminal of the transistor when the transistor is turned off.

Figure 30:
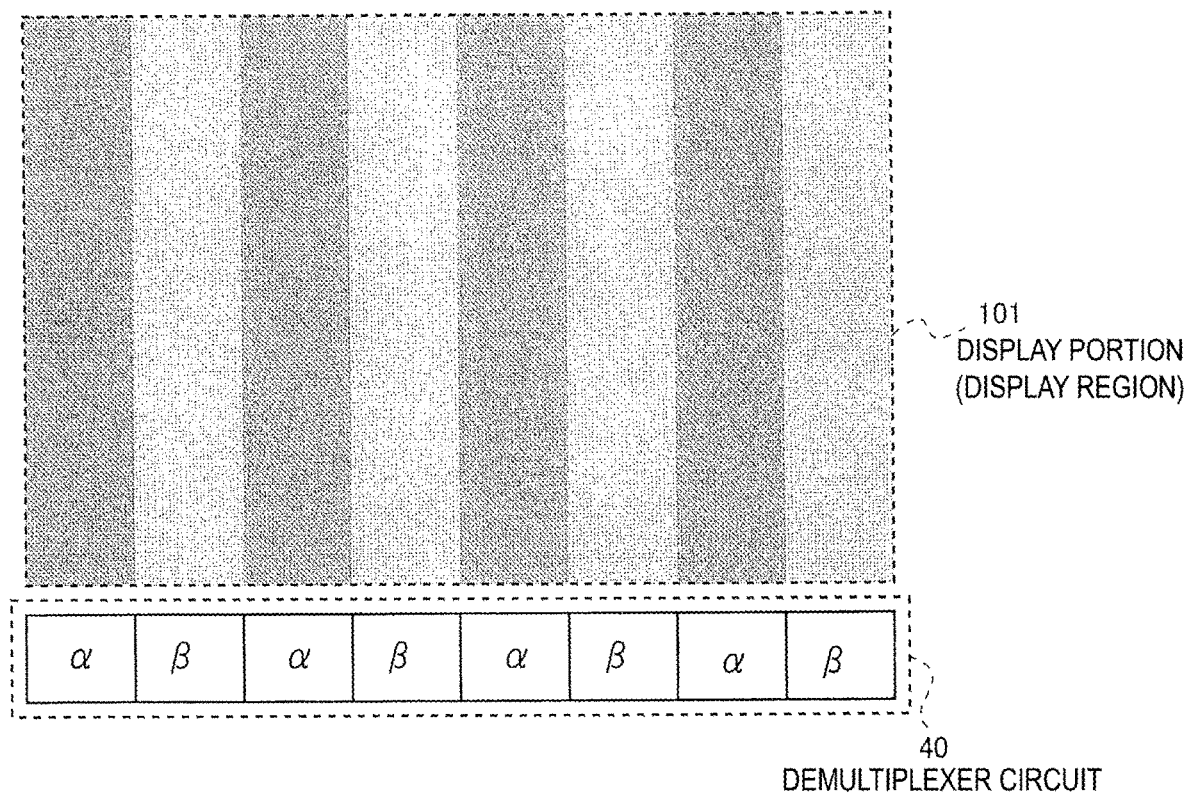
FIG. 30 is a diagram for describing a problem in a case where a gate metal pattern in the transistors of the demultiplexer circuit is shifted in the first embodiment.

In the above-described first embodiment, the G connection control transistor MGk in the α portion corresponds to the transistor Mα illustrated in FIG. 28, and the G connection control transistor MGk in the β portion corresponds to the transistor Mβ illustrated in FIG. 28 (see FIG. 6). As a result, even if each source line is driven so that the entire screen is displayed in the same gray scale, the block separation as illustrated in FIG. 30 may be visually recognized. Such a block separation is a phenomenon that may occur in a case where the multiplicity of the multiplexed data signal Doj (j=1 to m) input from the source driver 30 to the demultiplexer circuit 40 is an odd number. Thus, in this case, as in the present embodiment, it is preferable that the positional relationship between the drain D and the gate G (whether left side or right side in the drawing) is aligned in corresponding transistor (a connection control transistor corresponding to the same color among R, G, and B) in the α portion and the β portion.

Figure 29:
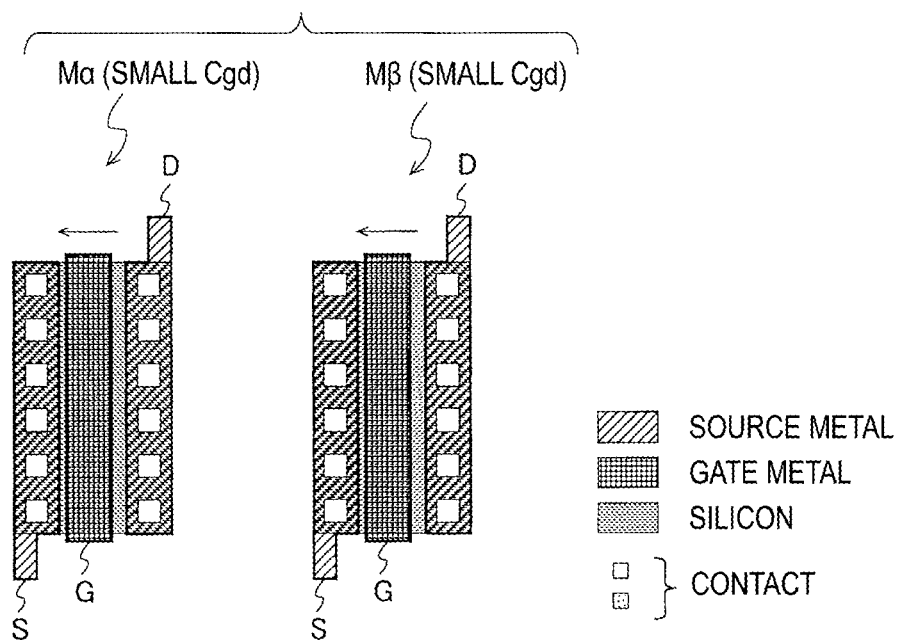
FIG. 29 is a diagram for describing a layout pattern for suppressing a feed-through voltage at a transistor as a switching element in a demultiplexer circuit.
Figure 31:
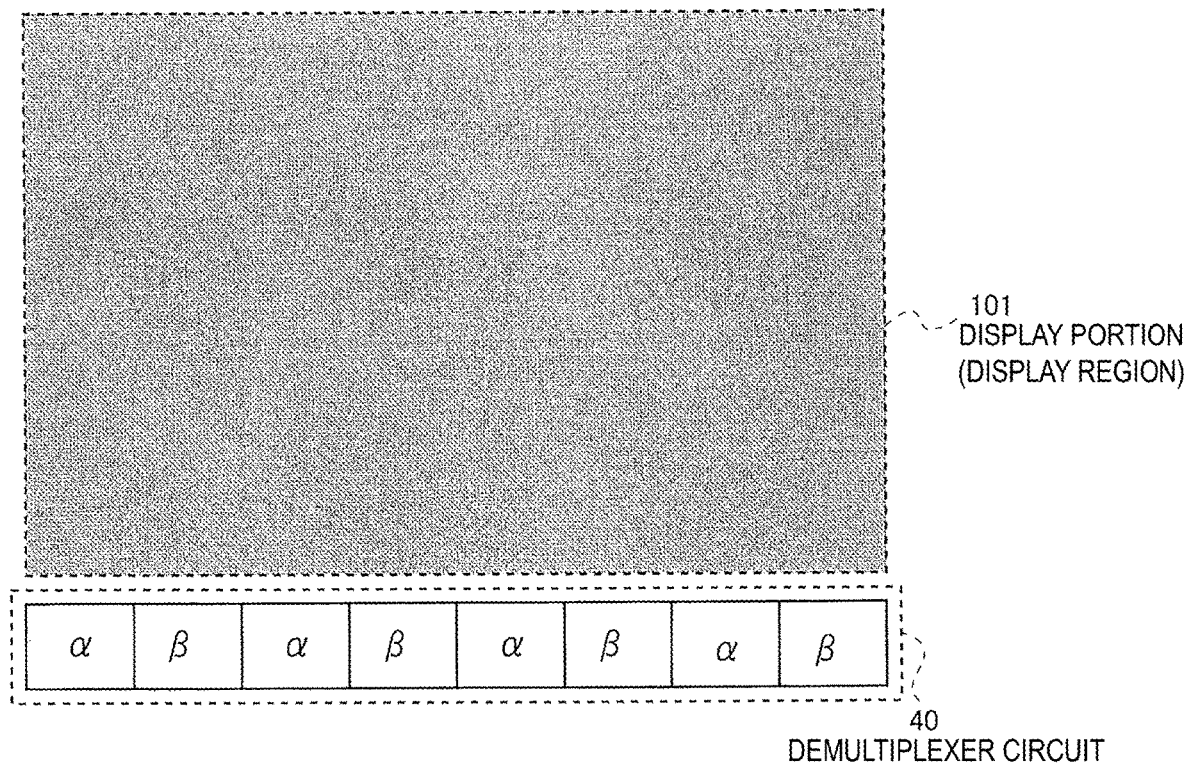
FIG. 31 is a diagram for describing an effect of a uniform gray levels display in a case where the gate metal pattern in the transistors of the demultiplexer circuit is shifted in the fifth embodiment.

FIG. 29 is a diagram for describing a layout pattern for suppressing a feed-through voltage at a transistor as a switching element in a demultiplexer circuit. Here, consider the case that, in a case of manufacturing the active matrix substrate 100, the gate metal is formed to be shifted to the left side (in the drawing) with respect to the source metal. In this case, since the drain D is arranged on the right side (in the drawing) of the gate G in both the two transistors Mα and Mβ illustrated in FIG. 29, the parasitic capacitance Cgd between the gate and the drain becomes smaller than the original value, and as a result, the feed-through voltage (absolute value), in other words the voltage ΔV given by the above-described Equation (1), generated in a case where the transistor in the demultiplexer circuit 40 changes from the on state to the off state becomes smaller than the original value. In the present embodiment, the G connection control transistor MGk in the α portion corresponds to the transistor Mα illustrated in FIG. 29, and the G connection control transistor MGk in the β portion corresponds to the transistor Mβ illustrated in FIG. 29 (see FIG. 27). In this way, if the positional relationship between the drain D and the gate G (whether left side or right side in the drawing) is the same in the corresponding transistor (a connection control transistor corresponding to the same color among R, G, and B) in the α portion and the β portion. in other words, if the drain D is arranged on the same side with respect to the gate G, even if the gate metal is formed to be shifted with respect to the source metal due to a variation in manufacturing of the active matrix substrate 100, in a case where each source line is driven so that the entire screen is displayed in the same gray scale, the block separation does not occur, and uniform gray scale display as illustrated in FIG. 31 is obtained.

6. Sixth Embodiment

The first to fifth embodiments have characteristics in the layout pattern of the demultiplexer circuit in the liquid crystal display device employing the SSD method (see FIG. 6, FIG. 14, FIG. 18, FIG. 23, and FIG. 27), and a layout pattern having similar characteristics can be employed for the video inspection circuit in the active matrix substrate of the liquid crystal display device as described below. An active matrix substrate including such a video inspection circuit will be described below as a sixth embodiment. Note that the active matrix substrate according to the present embodiment has the same configuration as that of the active matrix substrate according to the first embodiment (see FIG. 2) except that the video inspection circuit 60 is provided, and the same reference numerals are used for the same or corresponding portions, and detailed descriptions thereof will be omitted.

Figure 32:
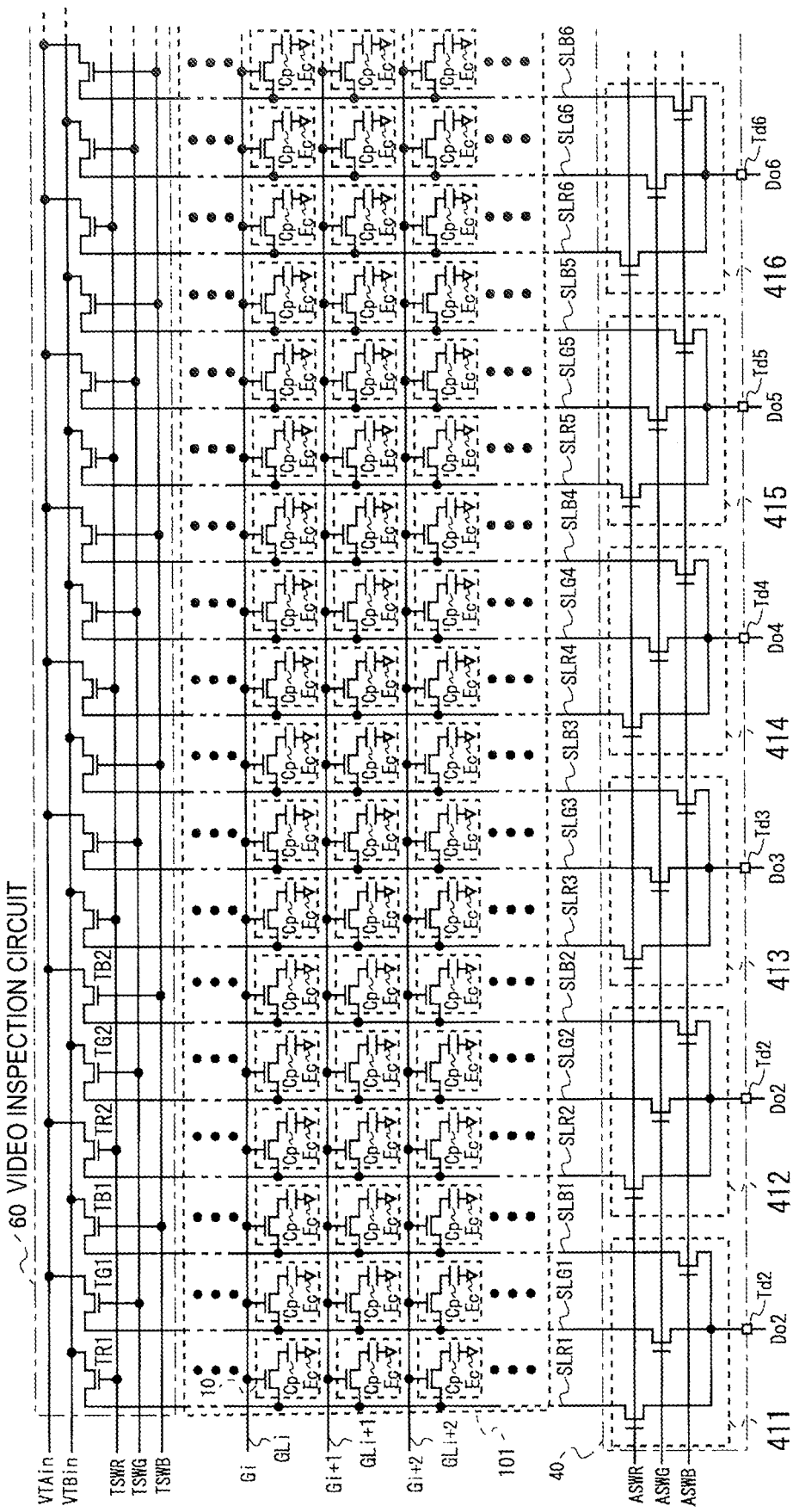
FIG. 32 is a circuit diagram for describing a video inspection circuit in a sixth embodiment.

FIG. 32 is a circuit diagram for describing a video inspection circuit 60 in the active matrix substrate according to the present embodiment. As illustrated in FIG. 32, in the active matrix substrate according to the present embodiment, the video inspection circuit 60 is provided on the opposite side of the demultiplexer circuit 40 with respect to the display portion 101, and the video inspection circuit 60 is connected to an end portion opposite to an end portion to which the demultiplexer circuit 40 is connected among 3 m source lines SLR1 SLG1, and SLB1 to SLRm, SLGm, and SLBm. The video inspection circuit 60 includes 3 m connection control transistors TR1, TG1, and TB1 to TRm, TGm, and TBm as switching elements connected to 3 m source lines SLR1, SLG1, and SLB1 to SLRm, SLGm, and SLBm, respectively, two inspection video signal lines for respectively transmitting inspection video signals VTAin and VTBin supplied from the outside, and three inspection control signal lines for transmitting inspection control signals TSWR, TSWG, and TSWB, respectively, for controlling the on/off of the 3 m connection control transistors TR1, TG1, and TB1 to TRm, TGm, and TBm. Each source line SLXj (j=1 to m, X=R, G, and B) in the display portion 101 is connected to any of the two inspection video signal lines via a corresponding connection control transistor TXj, and the gate terminal of each connection control transistor TXj is connected to the inspection control signal line transmitting the inspection control signal TSWX. The 3 m connection control transistors TR1, TG1, and TB1 to TRm, TGm, and TBm in the video inspection circuit 60 are grouped into m groups of connection control transistor groups with three connection control transistors TRj, TGj, and TBj, in which the inspection control signals TSWR, TSWG, and TSWB are respectively supplied to the gate terminals by the three inspection control signal lines and arranged adjacent to each other, as one group. Note that in the example illustrated in FIG. 32, although the two inspection video signal lines are provided in the video inspection circuit 60, one or three or more inspection video signal lines may be provided, and the appropriate number of signal lines is determined according to the shape specifications and inspection content of the display panel including the active matrix substrate according to the present embodiment.

The video inspection circuit 60 configured as described above receives inspection display data according to the inspection content as inspection video signals VTAin and VTBin (these video signals are time-division multiplexed inspection data signals to be applied to different source lines as necessary), and supplies the inspection video signal VTAin or VTBin to each source line SLXj (j=1 to m, X=R, G, and B) via each connection control transistor TXj as the switching element controlled by the inspection control signal TSWX. Accordingly, the video inspection circuit 60 is common to the demultiplexer circuit 40 (FIG. 2, FIG. 11, FIG. 15, and the like) in the first to fifth embodiments in that the video inspection circuit 60 includes the connection control transistor as the switching element connected to each source line SLXj, and controls the supply of the data signal as the video signal to each source line SLXj by the connection control transistor, and thus the video inspection circuit 60 and the demultiplexer circuit 40 can be considered as a signal supply control circuit having similar functions in a broader concept. Thus, in a case where the pixel pitch in the display portion 101 is narrow, the diagonal arrangement configuration is also employed in the layout pattern of the video inspection circuit 60.

Figure 33:
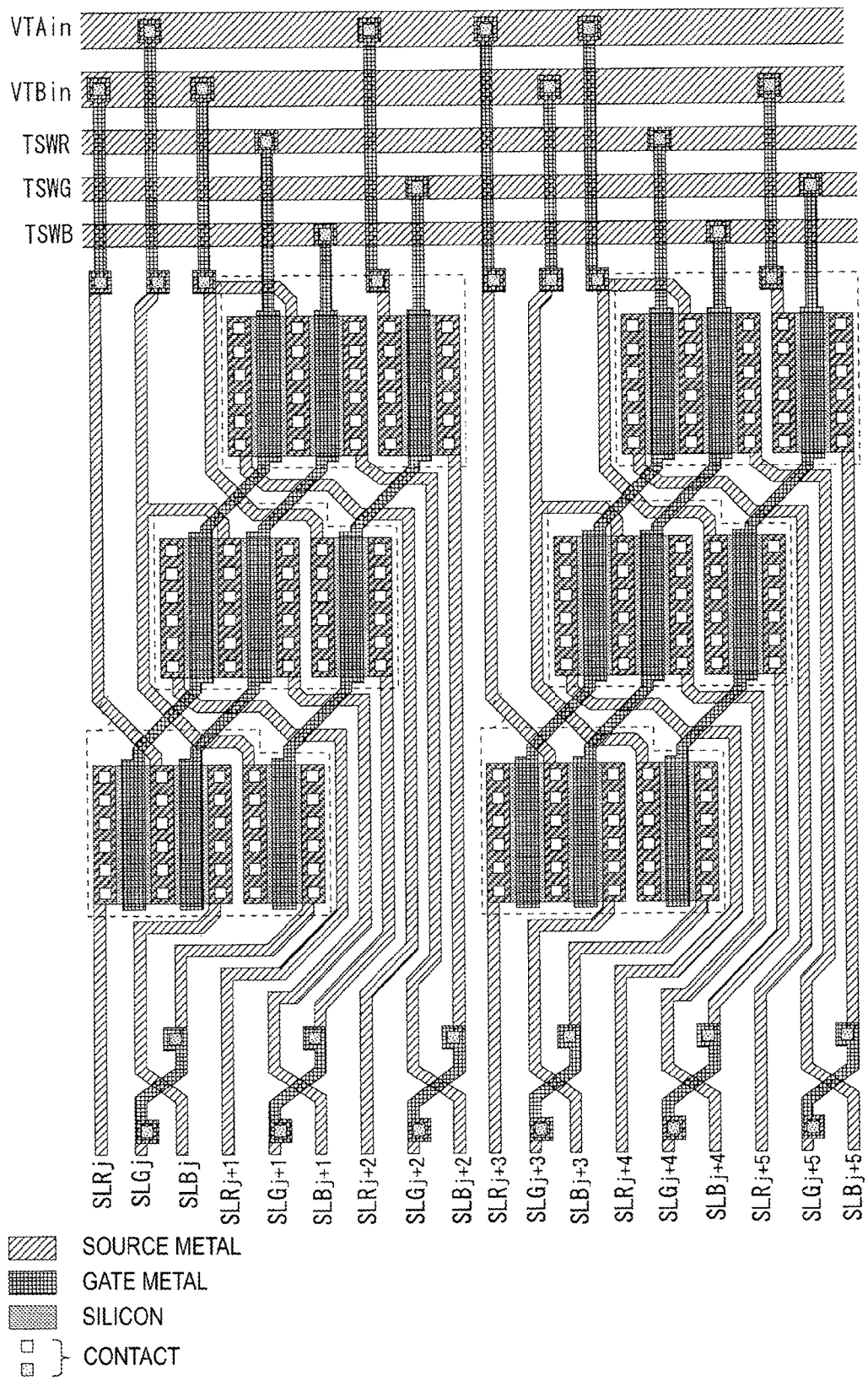
FIG. 33 is a layout diagram for describing a layout pattern of a video inspection circuit in a known active matrix substrate (fifth known example) corresponding to the sixth embodiment.

FIG. 33 is a layout diagram for describing a layout pattern of the video inspection circuit 60 in a known active matrix substrate (hereinafter referred to as "fifth known example") corresponding to the present embodiment. In this layout pattern, m groups of the connection control transistor group in the video inspection circuit 60 are grouped with three connection control transistor groups as one set, and nine control transistors included in the three groups of the connection control transistor group in each set are arranged to be aligned in the extending direction of the source line with the three transistors in one transistor group as a unit while positions of the nine control transistors included in the three connection control transistor groups in each set are sequentially shifted in the vertical direction with respect to the source line (In FIG. 33, the three transistors constituting one transistor group are surrounded by a dotted line. The same applies to FIG. 34 described below).

In the layout pattern illustrated in FIG. 33, in a case where a connection control transistor to which one of the adjacent source lines is connected and a connection control transistor to which the other is connected are included in sets different from each other, as in the (j+2)-th B source line SLBj+2 and the (j+3)-th R source line SLRj+3, path layout patterns for the adjacent source lines are significantly different, and the length of the one source line (SLBj+2) and the length of the other source line (SLRj+3) are also significantly different. As a result, significant difference occurs between the charging rate when the one source line (SLBj+2) is charged with a voltage of the data signal DBj+2 supplied thereto and the charging rate when the other source line (SLRj+3) is charged with a voltage of the data signal DRj+3 supplied thereto, and as a result, a display problem (such as the striped unevenness in the display screen) similar to that of the first to fourth known examples may occur.

Figure 34:
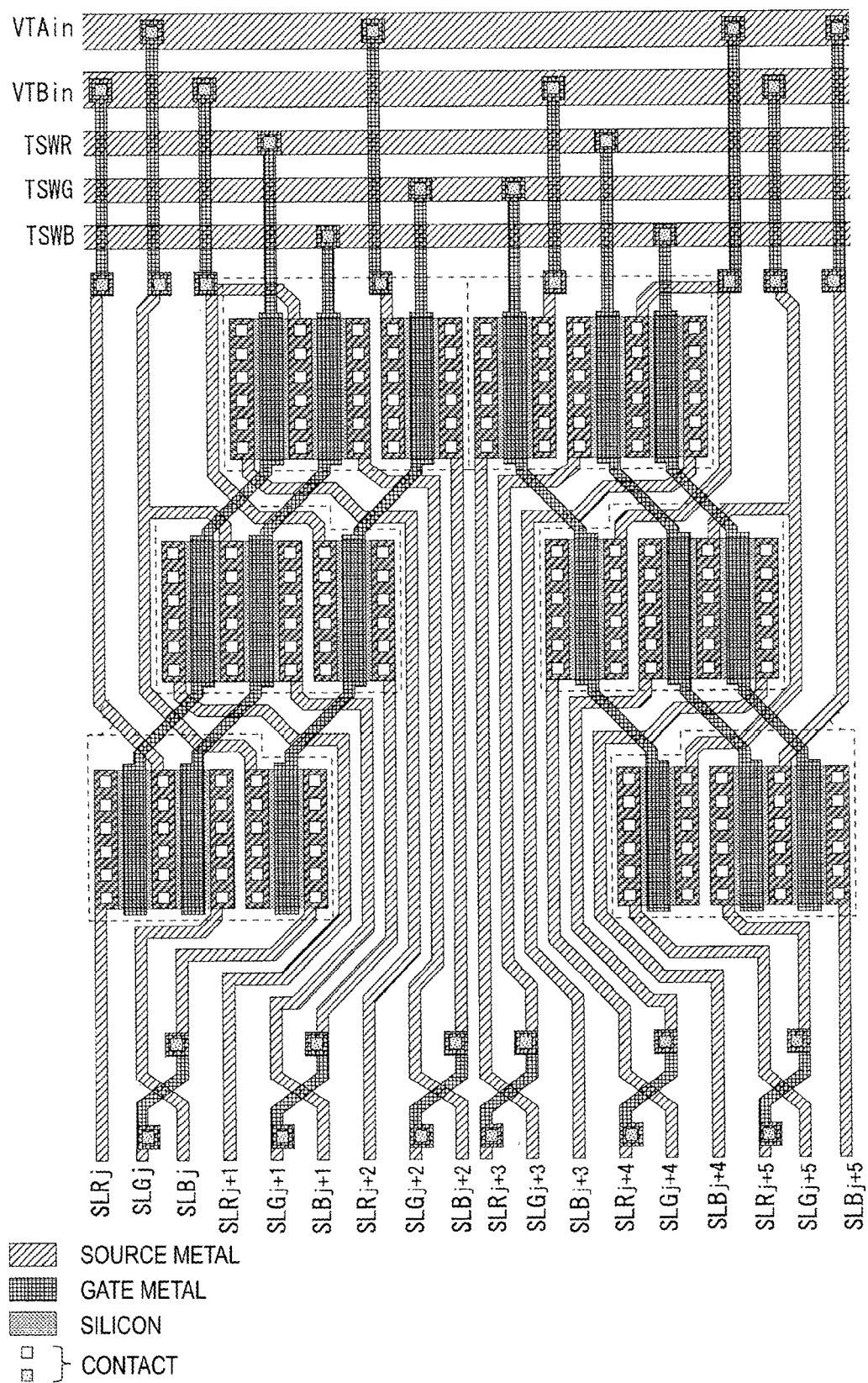
FIG. 34 is a layout diagram for describing a layout pattern of the video inspection circuit in the sixth embodiment.

In contrast, in the present embodiment, a layout pattern as illustrated in FIG. 34 is employed for the video inspection circuit 60 in order to suppress the occurrence of the above-described display problem (such as the striped unevenness). In other words, similar to the above-described fifth known example, nine connection control transistors in one set are arranged to be aligned in the extending direction of the source line with three transistors in one transistor group as a unit while positions of the nine connection control transistors in one set are sequentially shifted in the vertical direction with respect to the source line. However, unlike the fifth known example, in any two adjacent sets, a direction in which nine connection control transistors in one set are shifted in the vertical direction with respect to the source line with the three transistors as a unit and a direction in which nine connection control transistors in the other set are shifted in the vertical direction with respect to the source line with the three transistors as a unit are opposite to each other. In other words, the layout pattern of the video inspection circuit 60 is, similar to the above-described first embodiment (FIG. 6) and the like, configured to be the diagonal arrangement configuration in which the shift direction is alternately reversed for each set.

According to the present embodiment, although the lengths of the source lines SLXj (j=1 to m, X=R, G, and B) are different, similar to the above-described first embodiment, the difference between path layout patterns corresponding to any adjacent source lines are relatively small, and the lengths of the adjacent source lines will not be significantly different from each other. Thus, no significant difference in the charging rate occurs between the adjacent source lines when the inspection video signal VTAin or VTBin is supplied to the adjacent source lines. As a result, in the active matrix substrate in which the layout pattern of the video inspection circuit is configured to be the diagonal position configuration in order to correspond to a narrow pixel pitch, the occurrence of the display problem (such as the striped unevenness) is suppressed, and the inspection display based on the inspection video signals VTAin and VTBin can be favorably performed.

Note that in the present embodiment, although the video inspection circuit 60 is arranged on the opposite side of the demultiplexer circuit 40 with respect to the display portion 101 (FIG. 32), the video inspection circuit 60 may be arranged on the same side as the demultiplexer circuit 40. In the example illustrated in FIG. 32 and FIG. 34, one set is constituted by the three groups of the connection control transistor group, but one set may be constituted by two or four or more connection control transistor groups.

7. Modified Example and the Like

The present disclosure is not limited to the above-described embodiment described above, and various modifications may be made without departing from the scope of the present disclosure.

For example, in the first to fifth embodiments, each demultiplexers 41j is configured to demultiplex the multiplexed data signal Doj that is time-division multiplexed with a multiplicity of two or three (j=1 to m). However, the present disclosure may also be applied to an active matrix substrate including a demultiplexer 41j configured to demultiplex a multiplexed data signal Doj that is time-division multiplexed with a multiplicity of four or more.

In the above, the descriptions have been given with the liquid crystal display device employing the SSD method using the active matrix substrate as an example. However, the present disclosure is not limited thereto. The present disclosure can also be applied to display devices other than the liquid crystal display device, for example, an organic electro luminescence (EL) display device, as long as they are display devices of the SSD method.

In addition, the display device according to various modified examples can be configured in any combination so long as the characteristics of the display device according to the embodiments described above and the modified example thereof are not adversely affected by the properties thereof.

In any of the first to sixth embodiments, the connection control transistor as the switching element is connected to each source line in the display portion 101, and the video signal to be supplied as the data signal to each source line is supplied to the source line via the connection control transistor connected thereto, so that wiring line capacitance of the source line is charged. After the charging, the feed-through voltage (absolute value) ΔV generated when the connection control transistor changes from the on state to the off state is given by above-described Equation (1). According to the Equation (1), the feed-through voltage ΔV varies depending on the wiring line capacitance Csl of the source line, and the feed-through voltage ΔV decreases as the wiring line capacitance Csl of the source line increases. The wiring line capacitance Csl is the sum (Csld+C2) of a wiring line capacitance Csld of a portion in the display portion 101 and a wiring line capacitance C2 of a portion in the demultiplexer circuit 40 of the source line (see FIG. 5). In a case where the connection control transistor is an N-channel type and the source line is charged with a negative polarity data signal (video signal), and in a case where the connection control transistor is P-channel type and the source line is charged with a positive polarity data signal (video signal), the feed-through voltage ΔV operates in the direction to increase the charging rate of the source line. Thus, in these cases, in a case where the wiring line capacitance Csl increases due to the longer source line, not only the charging rate of the source line decrease due to an increase in the charging current (increase in the voltage drop) flowing through the connection control transistor in the on state (on resistance Ron) as described above (see FIG. 5), but also the charging rate of the source line decreases due to a decrease in the feed-through voltage (absolute value) ΔV. Accordingly, the above-described first to sixth embodiments (FIG. 6, FIG. 14, FIG. 18, FIG. 23, FIG. 27, and FIG. 34) employing the diagonal arrangement configuration of alternately reversing shift direction in the layout pattern of the demultiplexer circuit 40 and the video inspection circuit 60 are effective in suppressing the occurrence of the striped unevenness in the display screen from the point of reducing the difference in the feed-through voltage ΔV between adjacent source lines.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. An active matrix substrate comprising a display portion formed with a plurality of pixel circuits, the active matrix substrate comprising:
 a plurality of data signal lines configured to transmit a plurality of video signals representing an image to be displayed on the display portion to the plurality of pixel circuits; and
 a signal supply control circuit including a plurality of connection control switching elements respectively corresponding to the plurality of data signal lines and configured to supply each of the plurality of video signals to be applied to each of the plurality of data signal lines via corresponding each of the plurality of connection control switching elements,
 wherein the signal supply control circuit is a demultiplexer circuit including a plurality of demultiplexers respectively corresponding to a plurality of groups of data signal lines obtained by grouping the plurality of data signal lines with two or more data signal lines as one group and including a plurality of input terminals respectively corresponding to the plurality of demultiplexers,
 the demultiplexer circuit receives, at each of the plurality of input terminals, a multiplexed data signal in which two or more data signals that are video signals to be supplied to the two or more data signal lines in a group corresponding to each of the plurality of demultiplexers corresponding to the each of the plurality of input terminals are time-division multiplexed,
 each of the plurality of demultiplexers includes two or more connection control switching elements respectively corresponding to the two or more data signal lines in the group corresponding to the each of the plurality of demultiplexer, and is configured to supply two or more data signals obtained by demultiplexing the multiplexed data signal to be supplied to each of the input terminals corresponding to the each of the plurality of demultiplexers by the two or more connection control switching elements to the two or more data signal lines, respectively,
 in the demultiplexer circuit,
 the plurality of demultiplexers is grouped into a plurality of sets with a predetermined number of demultiplexers as one set,
 the connection control switching elements included in the predetermined number of demultiplexers in each of the plurality of sets are arranged to be aligned in an extending direction of the plurality of data signal lines with a predetermined number of the switching elements as a unit while positions of the connection control switching elements included in the predetermined number of demultiplexers in the each of the plurality of sets are sequentially shifted in a perpendicular direction with respect to the plurality of data signal lines, and
 in all two adjacent sets among the plurality of set, a direction in which positions of the connection control switching elements included in the predetermined number of demultiplexers of one set are shifted in the perpendicular direction with the predetermined number of switching elements as the unit and a direction in which positions of the connection control switching elements included in the predetermined number of demultiplexers of another set are shifted in the perpendicular direction with the predetermined number of switching elements as the unit are opposite to each other.

2. The active matrix substrate according to claim 1,
 wherein in the demultiplexer circuit, the connection control switching elements included in the predetermined number of the demultiplexers of each of the plurality of sets are arranged to be aligned in the extending direction of the plurality of data signal lines with the connection control switching elements included in one demultiplexer as a unit while positions of the connection control switching elements included in the predetermined number of the demultiplexers of each of the plurality of sets are sequentially shifted in the perpendicular direction with respect to the plurality of data signal lines.

3. The active matrix substrate according to claim 2,
 wherein each connection control switching element in each of the plurality of demultiplexers is constituted by either only one of an N-channel transistor or a P-channel transistor.

4. The active matrix substrate according to claim 2,
 wherein each connection control switching element in each of the plurality of demultiplexers is constituted by an N-channel transistor and a P-channel transistor connected in parallel with each other.

5. The active matrix substrate according to claim 4,
 wherein the N-channel transistor and the P-channel transistor constituting each connection control switching element in each of the plurality of demultiplexers are arranged to be aligned in the extending direction of the plurality of data signal lines.

6. The active matrix substrate according to claim 4,
 wherein the N-channel transistor and the P-channel transistor constituting each connection control switching element in each of the plurality of demultiplexers are arranged to be aligned in the perpendicular direction with respect to the plurality of data signal lines.

7. The active matrix substrate according to claim 1,
 wherein in the demultiplexer circuit, two or more control signal lines are arranged as control signal lines transmitting a plurality of types of control signals required for controlling the connection control switching elements included in each of the plurality of demultiplexers to the each of the plurality of demultiplexers, for each of the plurality of types of control signals.

8. The active matrix substrate according to claim 7,
 wherein in the demultiplexer circuit, sets in each of which the connection control switching elements are arranged such that positions of the connection control switching elements are shifted in the perpendicular direction in the same direction as a direction in which positions of the connection control switching elements included in the predetermined number of demultiplexers of the one set are shifted in the perpendicular direction with the predetermined number of switching elements as a unit are equally connected to the two or more control signal lines arranged for each of the plurality of types of control signals, and sets in each of which the connection control switching elements are arranged such that positions of the connection control switching elements are shifted in the perpendicular direction in the same direction as a direction in which positions of the connection control switching elements included in the predetermined number of demultiplexers of the another set are shifted in the perpendicular direction with the predetermined number of switching elements as a unit are equally connected to the two or more control signal lines arranged for each of the plurality of types of control signals.

9. The active matrix substrate according to claim 1,
wherein the connection control switching elements included in each of the plurality of demultiplexers are thin film transistors, and in the demultiplexer circuit, for each of the connection control switching elements included in the predetermined number of demultiplexers of the one set, for a thin film transistor as each of the switching elements and for a thin film transistor as each of the switching elements to which a control signal that is the same as or the same type as a control signal supplied to the each of the switching elements in the one set among the connection control switching elements included in the predetermined number of demultiplexers in the another set is supplied, the drain is arranged on the same side with respect to the gate.

10. The active matrix substrate according to claim 1,
wherein the plurality of connection control switching elements respectively corresponding to the plurality of data signal lines is a thin film transistor.

11. A display device comprising:
the active matrix substrate according to claim 1;
a data side drive circuit configured to supply, as a multiplexed data signal, a signal in which two or more data signals respectively to be supplied to the two or more data signal lines in the group corresponding to each of the plurality of input terminals are time-division multiplexed to the each of the plurality of input terminals; and a demultiplexing control circuit configured to generate demultiplexing control signals to control the connection control switching elements in each of the plurality of demultiplexers so that the two or more data signals respectively to be supplied to the two or more data signal lines in the group corresponding to each of the plurality of demultiplexers are generated by demultiplexing the multiplexed data signal supplied to each of the plurality of input terminals from the data side drive circuit by each of the plurality of demultiplexers corresponding to the each of the plurality of input terminal.

* * * * *